United States Patent
Jain et al.

(10) Patent No.: US 11,508,871 B2
(45) Date of Patent: Nov. 22, 2022

(54) HETEROSTRUCTURE INCLUDING A SEMICONDUCTOR LAYER WITH A VARYING COMPOSITION

(71) Applicant: Sensor Electronic Technology, Inc., Columbia, SC (US)

(72) Inventors: Rakesh Jain, Columbia, SC (US); Maxim S. Shatalov, Columbia, SC (US); Alexander Dobrinsky, Silver Spring, MD (US); Michael Shur, Vienna, VA (US)

(73) Assignee: Sensor Electronic Technology, Inc., Columbia, SC (US)

( * ) Notice: Subject to any disclaimer, the term of this patent is extended or adjusted under 35 U.S.C. 154(b) by 30 days.

(21) Appl. No.: 17/060,954

(22) Filed: Oct. 1, 2020

(65) Prior Publication Data

US 2021/0028325 A1    Jan. 28, 2021

Related U.S. Application Data

(63) Continuation of application No. 16/442,990, filed on Jun. 17, 2019, which is a continuation of application
(Continued)

(51) Int. Cl.
*H01L 33/00* (2010.01)
*H01L 33/32* (2010.01)
(Continued)

(52) U.S. Cl.
CPC .... *H01L 33/002* (2013.01); *H01L 31/022408* (2013.01); *H01L 31/03048* (2013.01);
(Continued)

(58) Field of Classification Search
CPC ....... H01L 31/03044; H01L 31/035272; H01L 33/04; H01L 33/32
See application file for complete search history.

(56) References Cited

U.S. PATENT DOCUMENTS

| 8,964,807 B1 | 2/2015 | McLaurin et al. |
| 9,647,168 B2 | 5/2017 | Jain et al. |

(Continued)

FOREIGN PATENT DOCUMENTS

| CN | 102623599 A   | 8/2012 |
| CN | 102931306 A * | 2/2013 |

(Continued)

OTHER PUBLICATIONS

Campbell, S., U.S. Appl. No. 15/966,022, Office Action 1, dated May 15, 2019, 23 pages.

(Continued)

*Primary Examiner* — Shaun M Campbell
(74) *Attorney, Agent, or Firm* — LaBatt, LLC

(57) ABSTRACT

An improved heterostructure for an optoelectronic device is provided. The heterostructure includes an active region, an electron blocking layer, and a p-type contact layer. The electron blocking layer is located between the active region and the p-type contact layer. In an embodiment, the electron blocking layer can include a plurality of sublayers that vary in composition.

20 Claims, 21 Drawing Sheets

Related U.S. Application Data

No. 15/966,022, filed on Apr. 30, 2018, now Pat. No. 10,804,423, which is a continuation-in-part of application No. 15/588,896, filed on May 8, 2017, now Pat. No. 10,069,034, which is a continuation of application No. 14/944,538, filed on Nov. 18, 2015, now Pat. No. 9,647,168, which is a continuation-in-part of application No. 14/475,638, filed on Sep. 3, 2014, now Pat. No. 9,653,631.

(60) Provisional application No. 62/492,470, filed on May 1, 2017, provisional application No. 62/081,222, filed on Nov. 18, 2014, provisional application No. 61/873,346, filed on Sep. 3, 2013.

(51) Int. Cl.
| | |
|---|---|
| *H01L 31/0352* | (2006.01) |
| *H01L 33/14* | (2010.01) |
| *H01L 31/105* | (2006.01) |
| *H01L 31/0224* | (2006.01) |
| *H01L 31/0304* | (2006.01) |
| *H01L 33/02* | (2010.01) |
| *H01L 31/109* | (2006.01) |
| *H01L 33/04* | (2010.01) |
| *H01L 33/06* | (2010.01) |

(52) U.S. Cl.
CPC .. *H01L 31/0352* (2013.01); *H01L 31/035236* (2013.01); *H01L 31/105* (2013.01); *H01L 31/109* (2013.01); *H01L 33/0025* (2013.01); *H01L 33/025* (2013.01); *H01L 33/04* (2013.01); *H01L 33/14* (2013.01); *H01L 33/145* (2013.01); *H01L 33/32* (2013.01); *H01L 33/06* (2013.01); *H01L 2933/0008* (2013.01)

(56) References Cited

U.S. PATENT DOCUMENTS

| | | | |
|---|---|---|---|
| 9,653,631 | B2 | 5/2017 | Jain et al. |
| 10,069,034 | B2 | 9/2018 | Jain et al. |
| 10,804,423 | B2 * | 10/2020 | Jain .................... H01L 31/0352 |
| 2002/0094002 | A1 | 7/2002 | Amano et al. |
| 2006/0118820 | A1 | 6/2006 | Gaska et al. |
| 2009/0008648 | A1 * | 1/2009 | Biwa .................... H01L 33/025 |
| | | | 257/E33.023 |
| 2010/0096615 | A1 | 4/2010 | Okamoto et al. |
| 2010/0270531 | A1 | 10/2010 | Samal |
| 2011/0266520 | A1 | 11/2011 | Shur et al. |
| 2012/0145993 | A1 | 6/2012 | Na et al. |
| 2012/0217473 | A1 | 8/2012 | Shur et al. |
| 2013/0082273 | A1 | 4/2013 | Ting |
| 2013/0099141 | A1 | 4/2013 | Chua |
| 2013/0193480 | A1 | 8/2013 | Sun et al. |
| 2013/0285076 | A1 | 10/2013 | Liu et al. |
| 2013/0299776 | A1 * | 11/2013 | Nakamura .......... H01L 33/0075 |
| | | | 438/46 |
| 2014/0014997 | A1 | 1/2014 | Kato et al. |
| 2014/0064314 | A1 | 3/2014 | Shur et al. |
| 2014/0158980 | A1 | 6/2014 | Shur et al. |
| 2014/0231745 | A1 * | 8/2014 | Northrup .............. H01S 5/0421 |
| | | | 438/47 |
| 2015/0280056 | A1 | 10/2015 | Northrup et al. |
| 2017/0263805 | A1 | 9/2017 | Jain et al. |
| 2018/0248071 | A1 | 8/2018 | Jain et al. |

FOREIGN PATENT DOCUMENTS

| | | |
|---|---|---|
| JP | 2008109066 A | 5/2008 |
| KR | 100714553 B1 | 5/2007 |
| KR | 20130013869 A | 2/2013 |
| KR | 20110134774 A | 6/2013 |
| KR | 20130067821 A | 6/2013 |

OTHER PUBLICATIONS

Campbell, S., U.S. Appl. No. 15/588,896, Notice of Allowance, dated Apr. 30, 2018, 32 pages.
Campbell, S., U.S. Appl. No. 14/475,638, Notice of Allowance, dated Jan. 17, 2017, 8 pages.
Campbell, S., U.S. Appl. No. 14/475,638, Final Office Action 2, dated Aug. 26, 2016, 16 pages.
Campbell, S., U.S. Appl. No. 14/475,638, Office Action 2, dated Apr. 6, 2016, 19 pages.
Campbell, S., U.S. Appl. No. 14/475,638, Final Office Action 1, dated Dec. 7, 2015, 14 pages.
Campbell, S., U.S. Appl. No. 14/475,638, Office Action 1, dated Aug. 20, 2015, 31 pages.
Campbell, S., U.S. Appl. No. 14/944,538, Notice of Allowance, dated Jan. 5, 2017, 11 pages.
Campbell, S., U.S. Appl. No. 14/944,538, Office Action 1, dated Aug. 26, 2016, 24 pages.
Chinese Application No. 201480048504.9, Notice of Allowance (English translation is not available), dated Feb. 24, 2018, 4 pages.
Chinese Application No. 201480048504.9, Office Action 1 (English translation is not available), dated Jun. 23, 2017, 9 pages.
Yoon, N., Korean Application No. 10-2016-7008858, Notice of Allowance (English translation is not available), dated Sep. 29, 2017, 3 pages.
Yoon, N., Korean Application No. 10-2016-7008858, Office Action 1 (with English translation), dated Jan. 18, 2017, 15 pages.
International application No. PCT/US2015/061263, International Search Report and Written Opinion, dated Mar. 4, 2016, 13 pages.
International Application No. PCT/US2014/053791, International Search Report and Written Opinion, dated Dec. 12, 2014, 12 pages.
Ayers, J., "Heteroepitaxy of Semiconductors, Theory, Growth, and Characterization," 2007, 3 pages.
Gong et al., "Optical power degradation mechanisms in AlGaN-based 280nm deep ultraviolet light-emitting diodes on sapphire," Applied Physics Letters, 2006, 4 pages.
Moe et al., "Current-induced degradation of high performance deep ultraviolet light emitting diodes," Applied Physics Letters, 2010, 4 pages.
Sawyer et al., "Degradation of AlGaN-based ultraviolet light emitting diodes," Solid-State Electron, 2008, 5 pages.
Campbell, S., U.S. Appl. No. 15/966,022, Final Office Action 1, dated Sep. 3, 2019, 25 pages.
Campbell, S., U.S. Appl. No. 15/966,022, Office Action 2, dated Jan. 28, 2020, 16 pages.
Campbell, S., U.S. Appl. No. 16/442,990, Office Action 1, dated Apr. 6, 2020, 22 pages.
Campbell, S., U.S. Appl. No. 15/966,022, Notice of Allowance, dated Jun. 10, 2020, 9 pages.
Campbell, S., U.S. Appl. No. 16/442,990, Notice of Allowance, dated Aug. 29, 2020, 10 pages.
Campbell, S., U.S. Appl. No. 17/061,091, Office Action 1, dated Feb. 9, 2022, 18 pages.
Campbell, S., U.S. Appl. No. 17/061,091, Final Office Action 1, dated May 20, 2022, 19 pages.
Campbell, S., U.S. Appl. No. 17/061,091, Notice of allowance, dated Sep. 22, 2022, 9 pages.

* cited by examiner

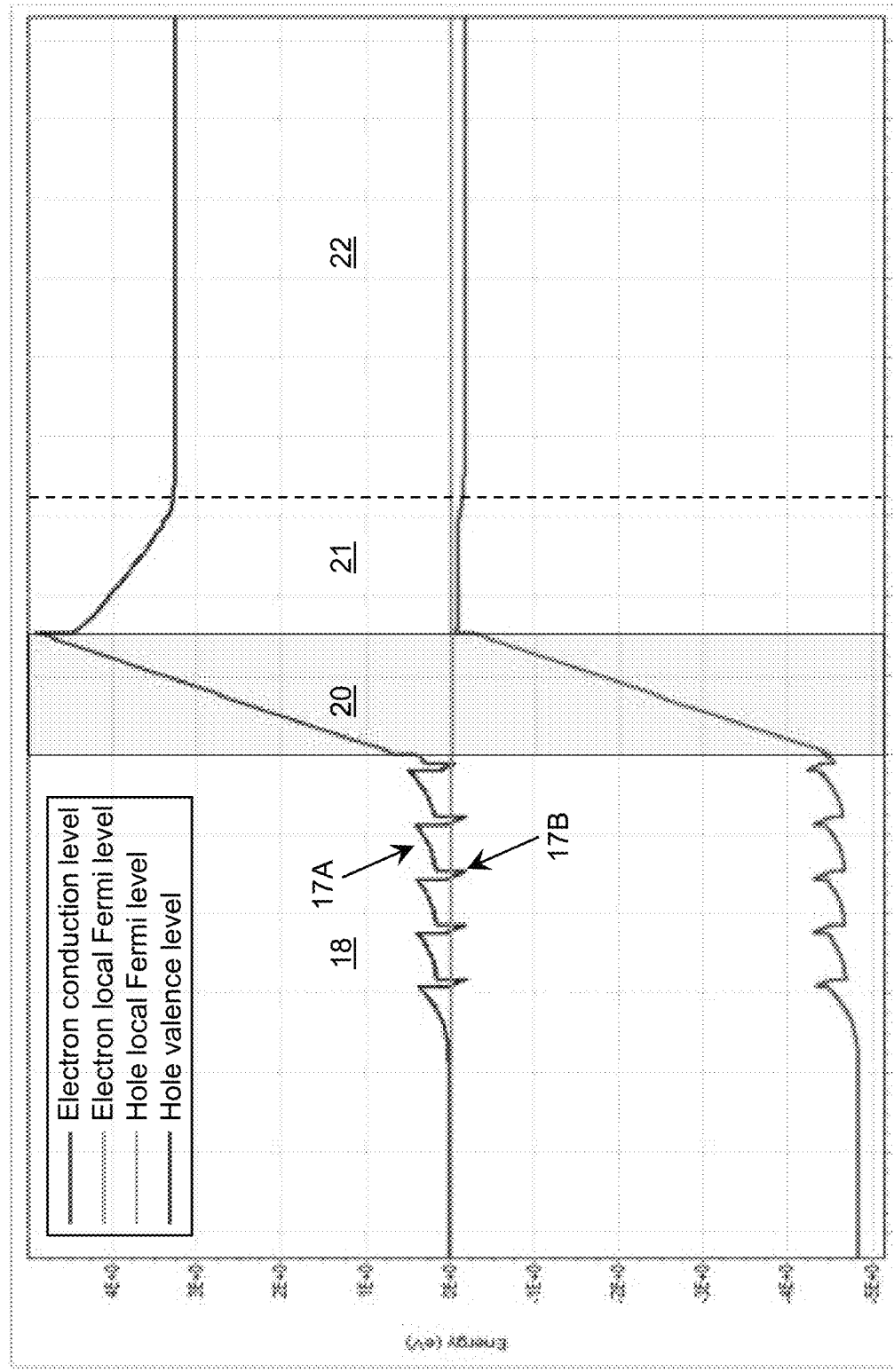

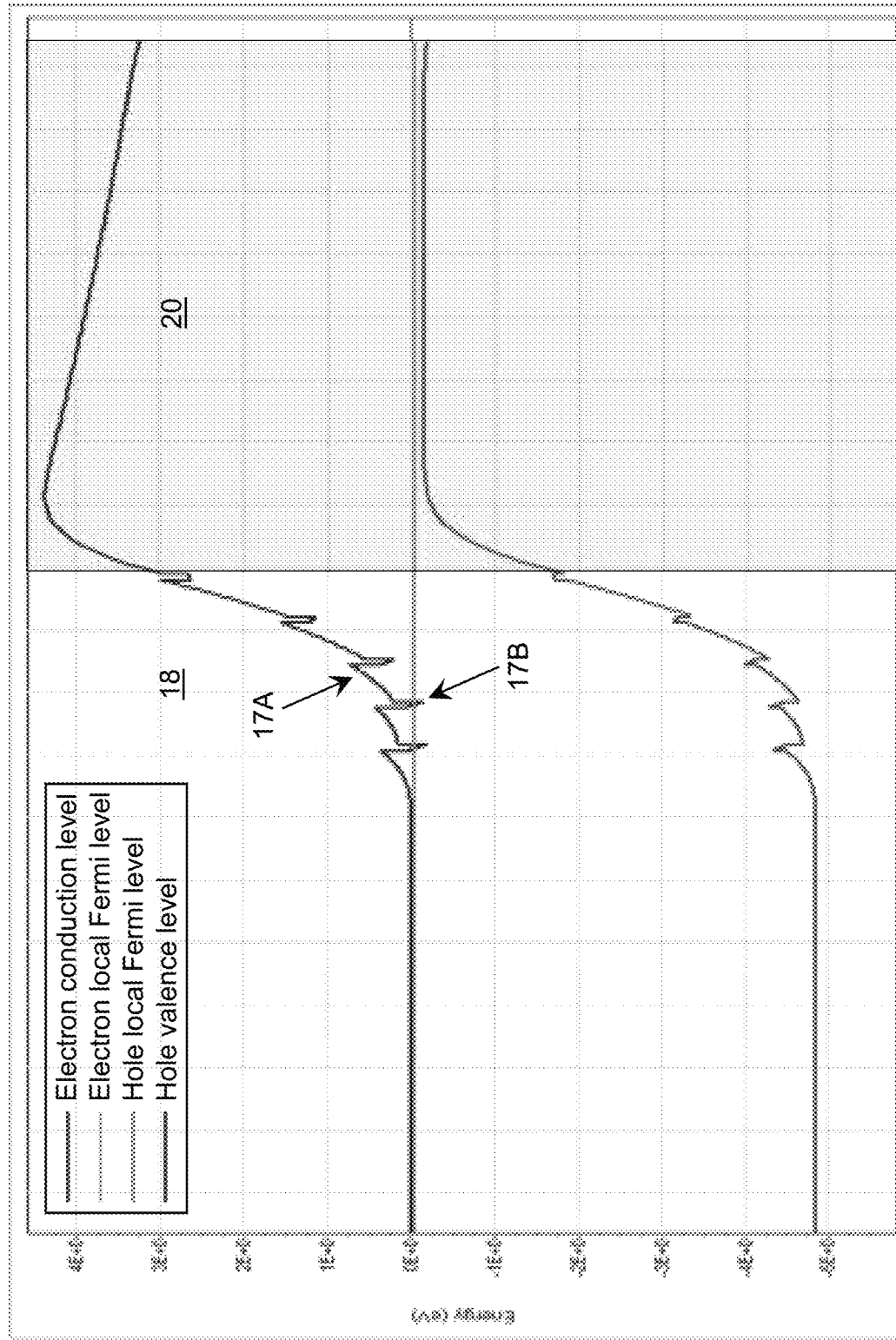

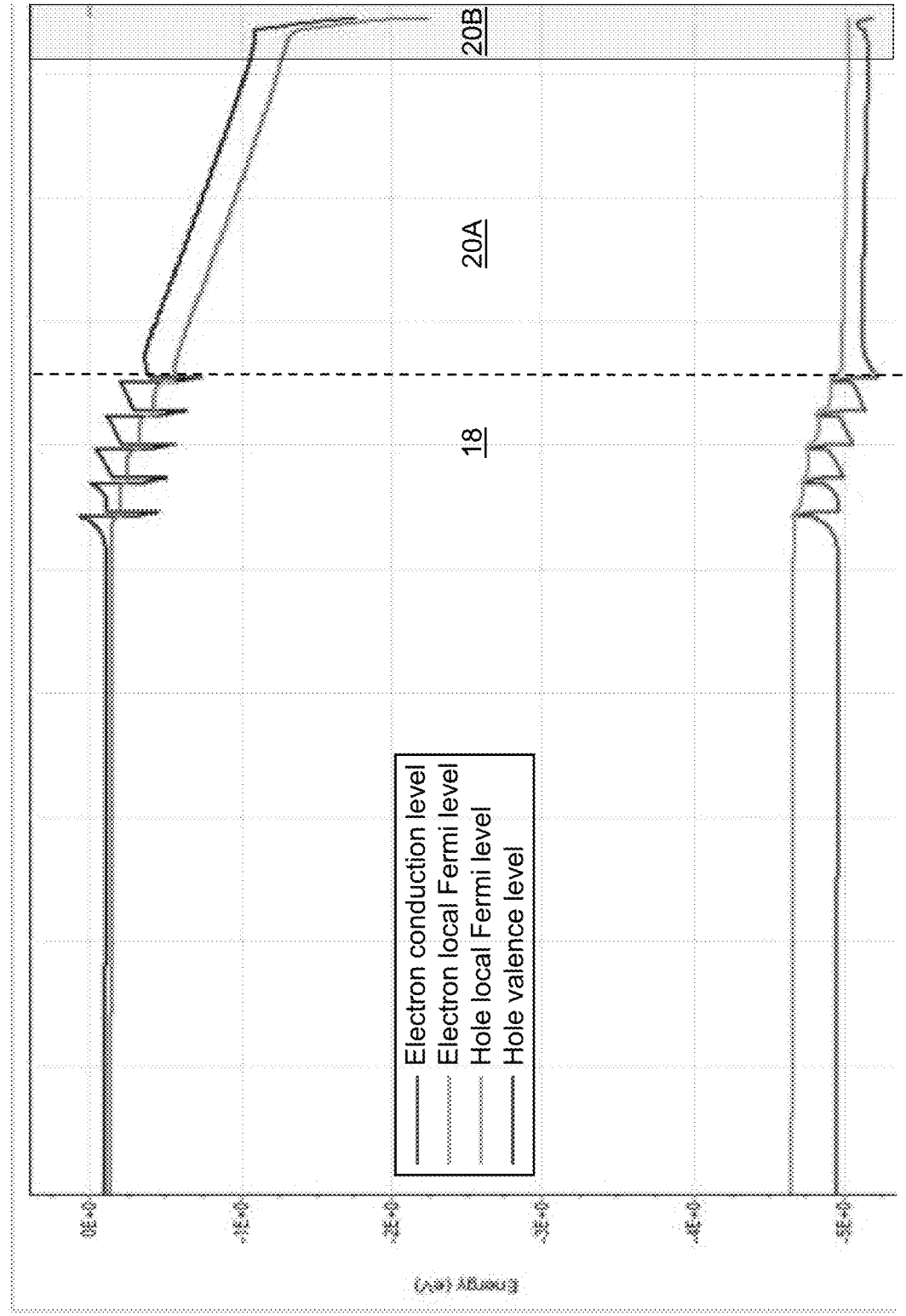

HETEROSTRUCTURE INCLUDING A SEMICONDUCTOR LAYER WITH A VARYING COMPOSITION

REFERENCE TO RELATED APPLICATIONS

The current application is a continuation application of U.S. patent application Ser. No. 16/442,990, filed on 17 Jun. 2019, which is a continuation application of U.S. patent application Ser. No. 15/966,022, filed on 30 Apr. 2018, which claims the benefit of U.S. Provisional Application No. 62/492,470, filed on 1 May 2017, and is a continuation-in-part of U.S. patent application Ser. No. 15/588,896, filed on 8 May 2017, now U.S. Pat. No. 10,069,034, issued on 4 Sep. 2018, which is a continuation of U.S. patent application Ser. No. 14/944,538, filed 18 Nov. 2015, now U.S. Pat. No. 9,647,168, issued on 9 May 2017, which claims the benefit of U.S. Provisional Application No. 62/081,222, filed on 18 Nov. 2014, and is a continuation-in-part of U.S. application Ser. No. 14/475,638, filed on 3 Sep. 2014, now U.S. Pat. No. 9,653,631, issued on 16 May 2017, which claims the benefit of U.S. Provisional Application No. 61/873,346, filed on 3 Sep. 2013, each of which is hereby incorporated by reference.

TECHNICAL FIELD

The disclosure relates generally to electronic and optoelectronic devices, and more particularly, to group III nitride based electronic and optoelectronic devices.

BACKGROUND ART

Development of group III nitride based electronic and optoelectronic devices with high efficiency and reliability depends on many factors, such as a quality of the semiconductor layers, active layer design, and contact quality. In particular, designing highly conductive p-type gallium nitride (GaN) and/or aluminum gallium nitride (AlGaN) is important for a number of electronic and optoelectronic devices, including ultraviolet light emitting diodes (UV LEDs). Achieving a high p-type conductivity of magnesium (Mg)-doped AlGaN has been difficult due to a large acceptor activation energy of 150-250 milli-electron Volts (meV), as well as due to a low hole mobility in heavily Mg-doped AlGaN alloys. The problem is particularly severe with increased molar fraction of aluminum due to a further increase of the acceptor activation energy and also due to an increase in unintentional donor concentration with the increasing aluminum molar fraction. For AlGaN layers having high aluminum molar fractions, the oxygen (O) donor concentration can result in insulating or even n-type characteristics of the AlGaN layers despite heavy Mg doping.

Additionally, heavy Mg doping can negatively affect the reliability of the optoelectronic device. The existence of degradation beyond device self-heating has been previously observed and attributed to the migration of Al atoms from the p-type cladding.

One proposed degradation mechanism for group III nitride based LEDs is electrons with high kinetic energies crossing the p-n junction, thereby causing a decrease in output power. This energy is transferred into the lattice, and more specifically to the electron blocking layer designed to confine electrons within the quantum wells of the active layer. The energy released by electrons assists in breaking both Mg-hydrogen (H) bonds, further activating carriers in the p-type layer, and Ga—N bonds, creating nitrogen vacancies, $V_N$. The increased Mg activation causes an initial rise in output power before reaching a steady-state, while the VN formation takes significantly longer to reach equilibrium and is responsible for the slow decrease in emission over a longer period of time. Alternatively, released electron energy may contribute to formation of Mg—$H_2$ complexes and result in an overall decrease of p-type doping. The energy of formation for the nitrogen vacancy in p-type AlGaN has been calculated to be significantly lower than that of p-type GaN. However, the Mg—$H_2$ complex is more stable in AlGaN than in GaN. Thus, in high-Al content devices, almost all of the atom displacement leads to VN formation, causing the slow further degradation observed in UV LEDs, which is manifested in an increase in the depletion edge on the p-side of the junction, which has been observed in the capacitance-voltage data, and which further shows that this behavior is amplified at higher current densities and associated operating temperatures.

Formation of nitrogen vacancies and other defects due to electron-lattice interaction results in effective trapping of holes in semiconductor layers. One approach to reduce degradation of semiconductor layers is through the use of a micro pixel device design, or by using LEDs with large planar area devices, which allow for reduced current densities and operating temperatures, limiting the velocity of electrons approaching the p-n junction, electron blocking layer, and p-type layer.

SUMMARY OF THE INVENTION

The inventors propose a new solution for reducing the formation of defects and hole trapping in p-type doped semiconductor layers. In an embodiment of the solution described herein, such a reduction is obtained based on modulation doping. In this manner, a reliability of the corresponding semiconductor device can be improved. In another embodiment, the reliability is further improved through concurrent optimization of several parameters of device heterostructure. Such parameters can include, for example, a compositional profile and doping profile of one or more of the semiconductor layers. Furthermore, optimization of strains within one or more of the semiconductor layers and the resultant polarization fields can significantly influence reliability of the device.

Aspects of the invention provide an improved heterostructure for an optoelectronic device. The heterostructure includes an active region, an electron blocking layer, and a p-type contact layer. The p-type contact layer and electron blocking layer can be doped with a p-type dopant. The dopant concentration for the electron blocking layer can be at most ten percent the dopant concentration of the p-type contact layer. A method of designing such a heterostructure is also described.

A first aspect of the invention provides a heterostructure comprising: an active region; a p-type contact layer having a p-type contact layer dopant concentration; and an electron blocking layer located between the active region and the p-type contact layer, wherein a p-type dopant concentration in the electron blocking layer is at most ten percent of the p-type contact layer dopant concentration.

A second aspect of the invention provides an optoelectronic device comprising: an n-type contact layer having an n-type doping; a p-type contact layer having a p-type contact layer dopant concentration; an active region located between the n-type contact layer and the p-type contact layer; and an electron blocking layer located between the active region and the p-type contact layer, wherein a p-type dopant concentration in the electron blocking layer is at most ten percent of the p-type contact layer dopant concentration.

A third aspect of the invention provides a method of fabricating a device, the method comprising: creating a device design for the device using a computer system, wherein the device design includes a heterostructure comprising: an active region; a p-type contact layer having a target p-type contact layer dopant concentration; and an electron blocking layer located between the active region and the p-type contact layer, wherein a target p-type dopant concentration for the electron blocking layer is at most ten percent of the target p-type contact layer dopant concentration; and providing the device design for use in fabricating the device according to the device design.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 9A-9C show a zero bias band diagram, a five volt bias band diagram, and a carrier concentration diagram for an illustrative heterostructure including an electron blocking layer according to an embodiment.

FIGS. 10A-10C show a zero bias band diagram, a five volt bias band diagram, and a carrier concentration diagram for an illustrative heterostructure including a graded electron blocking layer according to an embodiment.

FIGS. 11A and 11B show a five volt bias band diagram and a carrier concentration diagram for an illustrative heterostructure including a graded electron blocking layer with two distinct graded regions according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
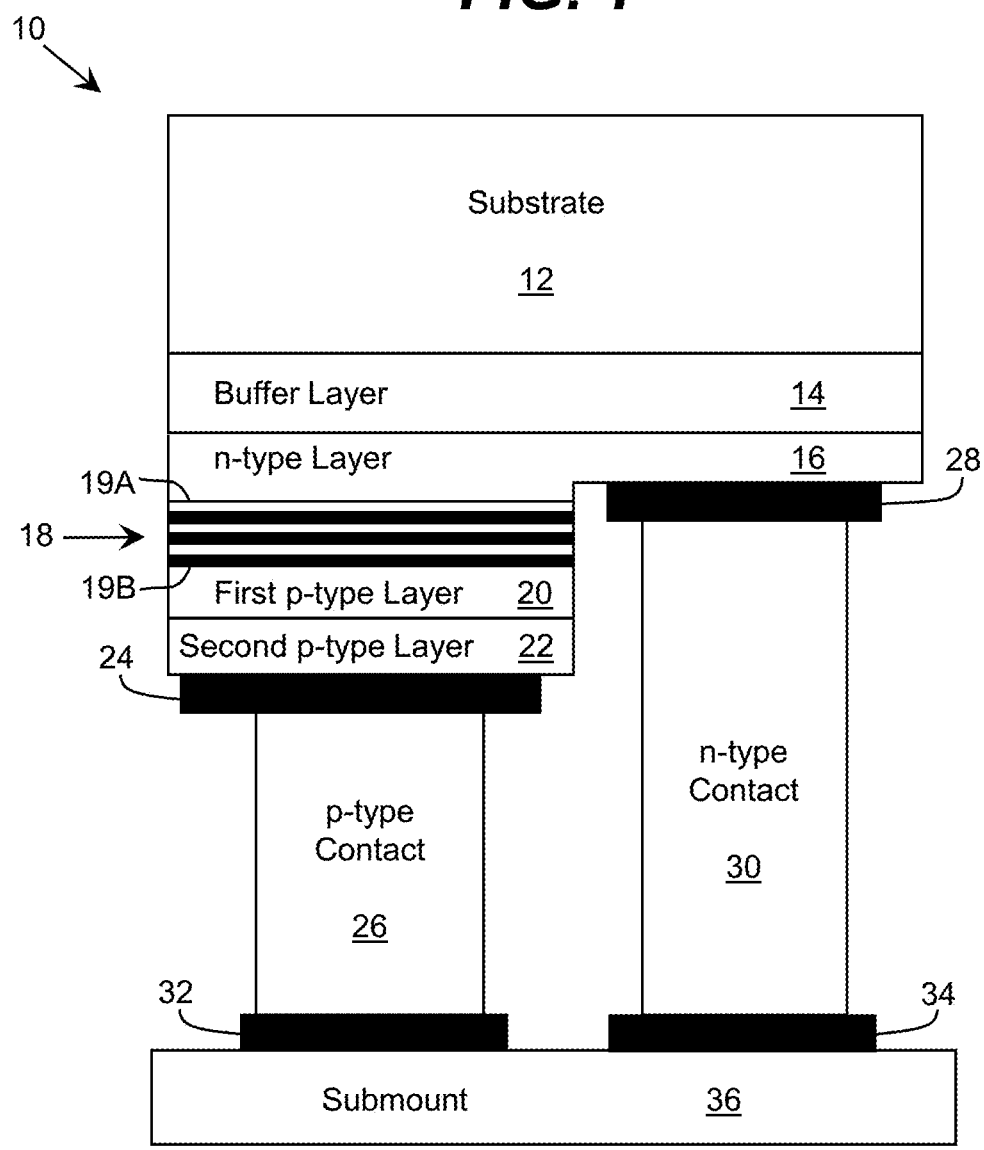
FIG. 1 shows a schematic structure of an illustrative optoelectronic device according to an embodiment.

As indicated above, aspects of the invention provide an improved heterostructure for an optoelectronic device. The heterostructure includes an active region, an electron blocking layer, and a p-type contact layer. The p-type contact layer and electron blocking layer can be doped with a p-type dopant. The dopant concentration for the electron blocking layer can be at most ten percent the dopant concentration of the p-type contact layer. A method of designing such a heterostructure is also described.

As used herein, unless otherwise noted, the term "set" means one or more (i.e., at least one) and the phrase "any solution" means any now known or later developed solution. As used herein, two materials have comparable compositions when the molar fractions of the corresponding materials differ by at most ten percent (five percent in a more specific embodiment). For example, considering two group III nitride materials, $Al_xIn_yB_zGa_{1-x-y-z}N$ and $Al_{x'}In_{y'}B_{z'}Ga_{1-x'-y'-z'}N$, the two materials have comparable compositions when each of the molar fractions x, y, and z differs from the corresponding molar fractions x', y', and z' by less than ten percent, where the percentage is calculated by taking a difference between the molar fractions and dividing the value by the higher molar fraction. Similarly, two layers have comparable thicknesses when the corresponding thicknesses differ by at most ten percent (five percent in a more specific embodiment). Unless otherwise specified, two layers have similar thicknesses when the respective thicknesses are within one nanometer (inclusive) of each other. Similarly, two layers have different thicknesses when the thicknesses differ by more than one nanometer. As also used herein, two dopant concentrations are comparable when they are on the same order as one another. It is understood that two numbers are on the same order as one another when a ratio of the higher number to the lower number is less than ten.

Compositions of two semiconductor layers also can be evaluated in conjunction with the corresponding band gaps. In this case, as used herein, compositions of two semiconductor layers are the same when the band gaps of the two semiconductor layers differ by less than the thermal energy unit, kT. The compositions of two semiconductor layers are substantially the same when the band gaps of the two semiconductor layers differ by less than three times the thermal energy unit, 3 kT. A composition of a first semiconductor layer is considered larger than a composition of a second semiconductor layer when the band gap of the first semiconductor layer is larger than the band gap of the second semiconductor layer by more than the thermal energy unit, kT. A composition of a first semiconductor layer is considered substantially larger than a composition of a second semiconductor layer when the band gap of the first semiconductor layer is larger than the band gap of the second semiconductor layer by more than three times the thermal energy unit, 3 kT. Unless otherwise specified, the thermal energy unit is approximated as 0.026 eV.

Aspects of the invention provide a heterostructure that can be incorporated into an optoelectronic device, such as a conventional or super luminescent light emitting diode (LED), a light emitting laser, a laser diode, a light sensor, a photodetector, a photodiode, an avalanche diode, and/or the like. Turning to the drawings, FIG. 1 shows a schematic structure of an illustrative optoelectronic device 10 according to an embodiment. In a more particular embodiment, the optoelectronic device 10 is configured to operate as an emitting device, such as a light emitting diode (LED). In this case, during operation of the optoelectronic device 10, application of a bias comparable to the band gap results in the emission of electromagnetic radiation from an active region 18 of the optoelectronic device 10. The electromagnetic radiation emitted by the optoelectronic device 10 can have a peak wavelength within any range of wavelengths, including visible light, ultraviolet radiation, deep ultraviolet radiation, infrared light, and/or the like. In an embodiment, the device 10 is configured to emit radiation having a dominant wavelength within the ultraviolet range of wavelengths. In a more specific embodiment, the dominant wavelength is within a range of wavelengths between approximately 210 and approximately 350 nanometers.

The optoelectronic device 10 includes a heterostructure comprising a substrate 12, a buffer layer 14 adjacent to the substrate 12, an n-type layer 16 (e.g., a cladding layer, electron supply layer, contact layer, and/or the like) adjacent to the buffer layer 14, and an active region 18 having an n-type side 19A adjacent to the n-type layer 16. Furthermore, the heterostructure of the optoelectronic device 10 includes a first p-type layer 20 (e.g., an electron blocking layer) adjacent to a p-type side 19B of the active region 18 and a second p-type layer 22 (e.g., a cladding layer, hole supply layer, contact layer, and/or the like) adjacent to the first p-type layer 20.

In a more particular illustrative embodiment, the optoelectronic device 10 is a group III-V materials based device, in which some or all of the various layers are formed of elements selected from the group III-V materials system. In a still more particular illustrative embodiment, the various layers of the optoelectronic device 10 are formed of group III nitride based materials. Group III nitride materials comprise one or more group III elements (e.g., boron (B), aluminum (Al), gallium (Ga), and indium (In)) and nitrogen (N), such that $B_WAl_XGa_YIn_ZN$, where $0 \le W, X, Y, Z \le 1$, and $W+X+Y+Z=1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

An illustrative embodiment of a group III nitride based optoelectronic device 10 includes an active region 18 (e.g., a series of alternating quantum wells and barriers) composed of $In_YAl_XGa_{1-x-y}N$, $Ga_ZIn_YAl_XB_{1-x-y-z}N$, an $Al_XGa_{1-x}N$ semiconductor alloy, or the like. Similarly, both the n-type cladding layer 16 and the first p-type layer 20 can be composed of an $In_YAl_XGa_{1-x-y}N$ alloy, a $Ga_ZIn_YAl_XB_{1-x-y-z}N$ alloy, or the like. The molar fractions given by x, y, and z can vary between the various layers 16, 18, and 20. The substrate 12 can be sapphire, silicon carbide (SiC), silicon (Si), GaN, AlGaN, AlON, $LiGaO_2$, or another suitable material, and the buffer layer 14 can be composed of AlN, an AlGaN/AlN superlattice, and/or the like. While further details of various layers are described in conjunction with AlGaN materials, it is understood that this material is only illustrative of various materials. To this extent, it is understood that embodiments of such layers also can comprise group III nitride materials including boron and/or indium. Additionally, other embodiments can include materials other than group III nitride materials, such as other group III-V materials.

As shown with respect to the optoelectronic device 10, a p-type metal 24 can be attached to the second p-type layer 22 and a p-type contact (electrode) 26 can be attached to the p-type metal 24. Similarly, an n-type metal 28 can be attached to the n-type layer 16 and an n-type contact (electrode) 30 can be attached to the n-type metal 28. The p-type metal 24 and the n-type metal 28 can form ohmic contacts to the corresponding layers 22, 16, respectively. In an embodiment, the p-type metal 24 and the n-type metal 28 each comprise several conductive and reflective metal layers, while the n-type contact 30 and the p-type contact 26 each comprise highly conductive metal. In an embodiment, the second p-type layer 22 and/or the p-type contact 26 can be transparent (e.g., semi-transparent or transparent) to the electromagnetic radiation generated by the active region 18. For example, the second p-type layer 22 and/or the p-type contact 26 can comprise a short period superlattice lattice structure, such as an at least partially transparent magnesium (Mg)-doped AlGaN/AlGaN short period superlattice structure (SPSL). Furthermore, the p-type contact 26 and/or the n-type contact 30 can be reflective of the electromagnetic radiation generated by the active region 18. In another embodiment, the n-type layer 16 and/or the n-type contact 30 can be formed of a short period superlattice, such as an AlGaN SPSL, which is transparent to the electromagnetic radiation generated by the active region 18.

As used herein, a layer is a transparent layer when the layer allows at least ten percent of radiation having a target wavelength, which is radiated at a normal incidence to an interface of the layer, to pass there through. Furthermore, as used herein, a layer is a reflective layer when the layer reflects at least ten percent of radiation having a target wavelength, which is radiated at a normal incidence to an interface of the layer. In an embodiment, the target wavelength of the radiation corresponds to a wavelength of radiation emitted or sensed (e.g., peak wavelength +/−five nanometers) by the active region 18 during operation of the device 10. For a given layer, the wavelength can be measured in a material of consideration and can depend on a refractive index of the material.

As further shown with respect to the optoelectronic device 10, the device 10 can be mounted to a submount 36 via the contacts 26, 30 in a flip chip configuration. In this case, the substrate 12 is located on the top of the optoelectronic device 10. To this extent, the p-type contact 26 and the n-type contact 30 can both be attached to a submount 36 via contact pads 32, 34, respectively. The submount 36 can be formed of aluminum nitride (AlN), silicon carbide (SiC), and/or the like.

Any of the various layers of the optoelectronic device 10 can comprise a substantially uniform composition or a graded composition. For example, a layer can comprise a graded composition at a heterointerface with another layer. In an embodiment, the first p-type layer 20 comprises a p-type electron blocking layer having a graded composition. The graded composition(s) can be included to, for example, reduce stress, improve carrier injection, and/or the like. Similarly, a layer can comprise a superlattice including a plurality of periods, which can be configured to reduce stress, and/or the like. In this case, the composition and/or width of each period can vary periodically or aperiodically from period to period.

It is understood that the layer configuration of the optoelectronic device 10 described herein is only illustrative. To this extent, a heterostructure for an optoelectronic device can include an alternative layer configuration, one or more additional layers, and/or the like. As a result, while the various layers are shown immediately adjacent to one another (e.g., contacting one another), it is understood that one or more intermediate layers can be present in a heterostructure for an optoelectronic device. For example, an illustrative heterostructure for an optoelectronic device can include an undoped layer between the active region 18 and one or both of the second p-type layer 22 and the n-type layer 16.

Furthermore, a heterostructure for an optoelectronic device can include a Distributive Bragg Reflector (DBR) structure, which can be configured to reflect light of particular wavelength(s), such as those emitted by the active region 18, thereby enhancing the output power of the device/heterostructure. For example, the DBR structure can be located between the second p-type layer 22 and the active region 18. Similarly, a heterostructure for an optoelectronic device can include a p-type layer 20 located between the second p-type layer 22 and the active region 18. The DBR structure and/or the p-type layer 20 can have any composition selected based on a desired wavelength of the light generated by the device. In one embodiment, the DBR structure has a Mg, Mn, Be, or Mg+Si-doped p-type composition. The p-type layer 20 can have a p-type AlGaN, AlInGaN, and/or the like. It is understood that a heterostructure for an optoelectronic device can include both the DBR structure and the p-type layer 20 (which can be located between the DBR structure and the second p-type layer 22) or can include only one of the DBR structure or the p-type layer 20. In an embodiment, the p-type layer 20 can be included in the device/heterostructure in place of an electron blocking layer. In another embodiment, the p-type layer 20 can be included between the second p-type layer 22 and the electron blocking layer.

Additional aspects of the invention are discussed in conjunction with a group III nitride heterostructure. In particular, adjustment of aluminum content within layers of the group III nitride heterostructure is used to illustrate aspects of the invention. However, it is understood that this is only illustrative, and the invention can be applied to various types of materials and elements in the materials. Similarly, while aspects of the invention are shown and described in conjunction with the p-type side of an active region, it is understood that embodiments of the invention can be applied to the design and configuration of one or more layers located on the n-type side of the active region and/or the active region itself.

Figure 2:
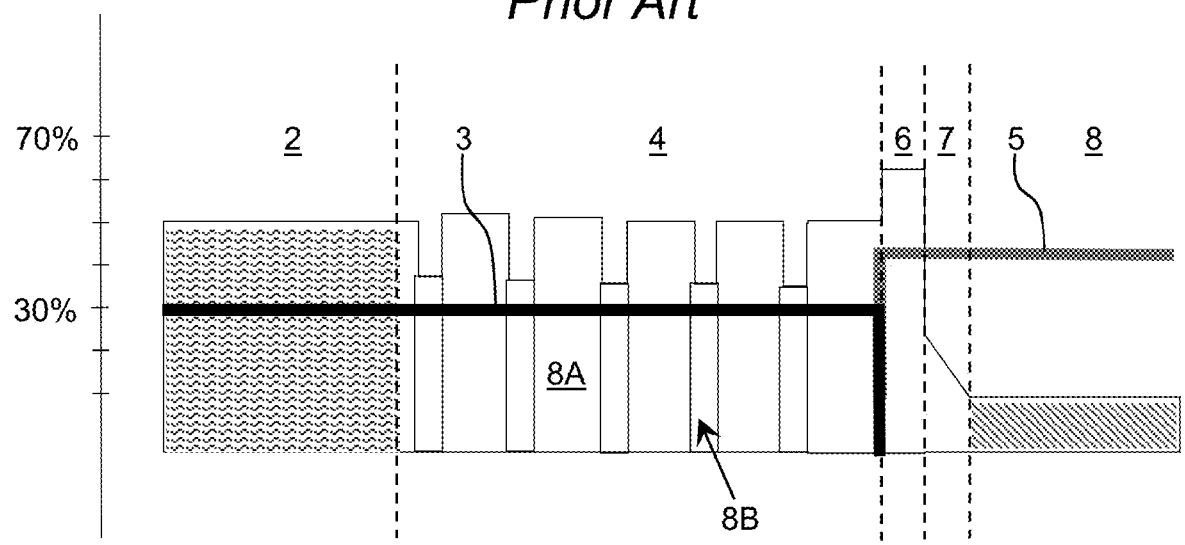
FIG. 2 shows a typical composition profile of a portion of a heterostructure for an optoelectronic device according to the prior art.

FIG. 2 shows a typical composition profile of a portion of a group III nitride heterostructure for an optoelectronic device according to the prior art. In this case, the heterostructure includes a n-type layer 2, an active region 4 including barriers 8A and quantum wells 8B, and an electron blocking layer 6. The electron blocking layer 6 has a high aluminum content and is designed to trap electrons in the active region 4. The electron blocking layer 6 can be followed by a graded interlayer 7 and a p-type layer 8. The composition profile illustrates a percentage of aluminum present in each layer relative to the other group III elements as well as a doping profile for a dopant present in each layer. As illustrated, the percentage of aluminum present can be: approximately fifty percent in the n-type layer 2 and the barriers 8A; approximately forty percent for the quantum wells 8B; approximately sixty percent in the electron blocking layer; between approximately twenty-five percent and approximately ten percent in the graded interlayer 7; and approximately ten percent in the p-type layer 8. The composition profile also illustrates the doping profiles 3, 5 for the various layers. In general, the n-type layer 2 and the active region 4 include an n-type doping 3, such as silicon (Si) donors. The electron blocking layer 6, the graded interlayer 7, and the p-type layer 8 can each include a p-type doping 5. As illustrated by the corresponding doping profiles, each of the n-type doping 3 and p-type doping 5 is typically of a constant doping concentration, e.g., approximately $1 \times 10^{18}$ cm$^{-3}$, between all of the layers.

In an embodiment, one or more of the p-type layers of the heterostructure of an optoelectronic device has a significantly different doping profile (e.g., concentration of dopants) than that of the p-type doping 5 of the prior art. The doping profile(s) and/or additional compositional fluctuations of the p-type layer(s) can be configured, for example, to improve internal quantum efficiency of the corresponding device, e.g., through carrier localization, over that provided by devices of the prior art (e.g., having a composition profile as shown in FIG. 2). Furthermore, the doping profile(s) and/or compositional fluctuations can improve a reliability of the corresponding device over that of prior art devices, e.g., through configuration of strains and resulting polarization fields within the semiconductor layers.

Figure 3A:
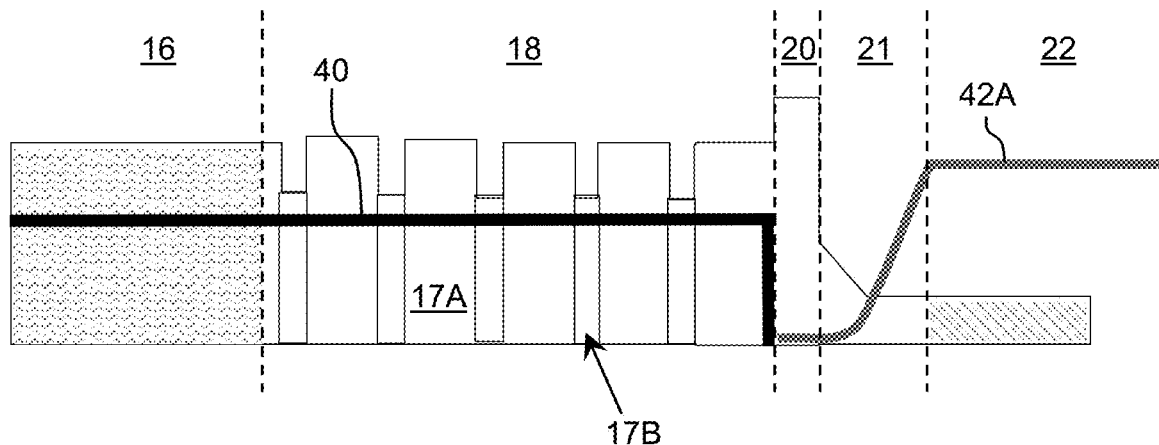
FIGS. 3A and 3B show illustrative composition profiles of a portion of a group III nitride heterostructure for an optoelectronic device according to embodiments.
Figure 3B:
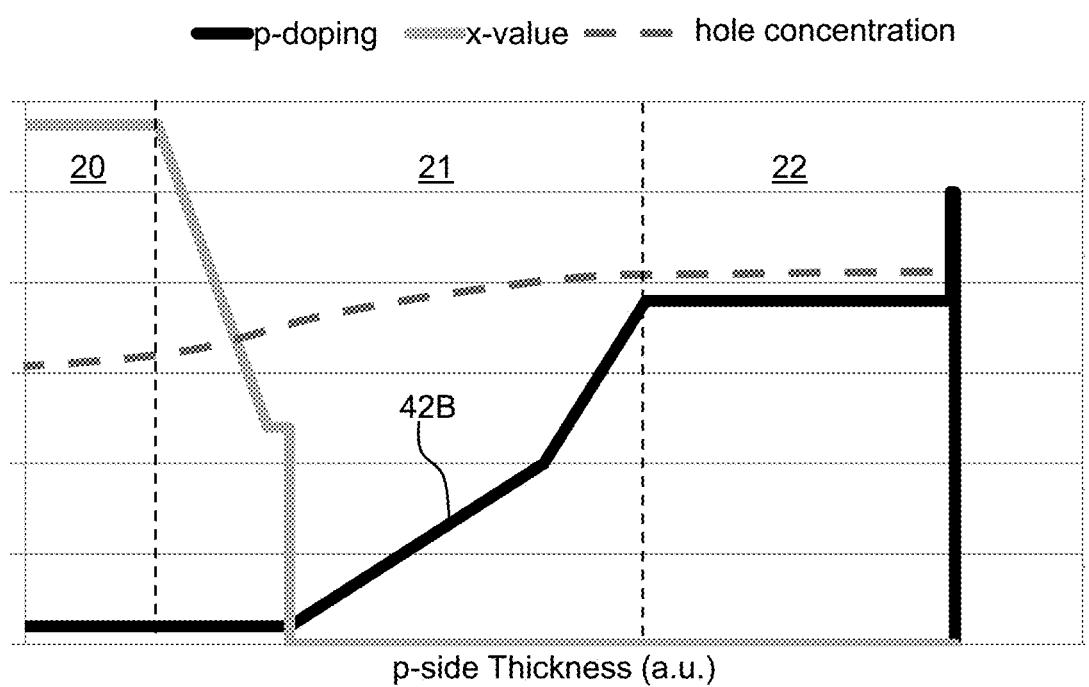

FIGS. 3A and 3B show illustrative composition profiles of a portion of a group III nitride heterostructure for an optoelectronic device, such as the optoelectronic device 10 shown in FIG. 1, according to embodiments. These composition profiles show the molar ratio of AlN as a function of device thickness. As shown in FIG. 3A, the heterostructure includes an n-type layer 16 (e.g., an n-type contact layer), an active region 18 (including a plurality of quantum wells and barriers), an electron blocking layer 20, and a p-type contact layer 22. Additionally, the heterostructure is shown including a p-type interlayer 21 located between the electron blocking layer 20 and the p-type contact layer 22. The electron blocking layer 20 can have a thickness in a range of one to one hundred nanometers (ten to one hundred nanometers in a more particular embodiment), while the p-type interlayer 21 can have a thickness in a range of ten to one thousand nanometers. The p-type contact layer 22 can have a thickness of at least one hundred nanometers. In an embodiment, the composition profiles can correspond to a percentage of aluminum present in each layer relative to the other group III elements as well as a doping profile for a dopant present in each layer. In a more particular embodiment, the percentages of aluminum are similar to those described in conjunction with FIG. 2. However, it is understood that this is only illustrative and each layer can have any type of material selected based on one or more target attributes of the layer and/or corresponding device.

In general, the electron blocking layer 20 is configured to trap electrons within the active region 18. To do so, a band gap of the electron blocking layer 20 can be higher than a typical band gap of the barriers 17A located within the active region 18. One approach for increasing the band gap of a group III-V semiconductor layer is to increase the aluminum content in the layer. In an embodiment, at least a portion (e.g., three atomic monolayers or more) of the electron blocking layer 20 has an aluminum molar fraction at least three percent higher than the aluminum molar fraction of the barrier 17A in the active region 18 with the highest aluminum molar fraction. When the active region 18 includes barriers 17A having different and/or varying aluminum molar fractions, the aluminum molar fraction of the portion of the electron blocking layer 20 can exceed the highest aluminum molar fraction located within the active region 18 by at least three percent.

The n-type layer 16 and the active region 18 can include an n-type doping 40 using any appropriate donors, such as silicon (Si) donors, or the like. As illustrated, the n-type doping 40 can provide a constant doping concentration across the layers 16, 18, e.g., approximately $1 \times 10^{18}$ cm$^{-3}$, which produces a uniform n-type doping profile 40. However, as shown in FIGS. 3A and 3B, the p-type layers 20, 21, 22 can have a non-uniform p-type doping profile 42A, 42B using any appropriate acceptors, such as magnesium (Mg) acceptors, or the like. In particular, a doping concentration for the p-type doping in the electron blocking layer 20 is substantially less than that of the doping concentration of the p-type doping in the contact layer 22. The p-type doping 42A in the contact layer 22 can have a dopant concentration density in a range of $1 \times 10^{18}$ cm$^{-3}$ and $1 \times 10^{19}$ cm$^{-3}$. In an embodiment, the doping concentration of the electron blocking layer 20 is at most ten percent of the doping concentration of the p-type contact layer 22. Conversely, an aluminum content (i.e., the aluminum molar fraction indicated by the x-value shown in FIG. 3B) of the electron blocking layer 20 can be significantly higher than the aluminum content of the p-type contact layer 22.

When included, the p-type interlayer 21 can provide a transition between the electron blocking layer 20 and the p-type contact layer 22. However, it is understood that the physical properties of the p-type interlayer 21 are different from the physical properties of both the electron blocking layer 20 and the p-type contact layer 22. The p-type interlayer 21 can be configured to act as a stress relieving layer, e.g., to relieve stress in the electron blocking layer 20 and the p-type contact layer 22, which would otherwise be present due to a large lattice mismatch between the electron blocking layer 20 and the p-type contact layer 22. Furthermore, the p-type interlayer 21 can be configured to reduce stress present in the active region 18. A reduction of the stress is accomplished by reducing the lattice mismatch between the electron blocking layer 20 and p-type contact layer 22 through the inclusion of the p-type interlayer 21. The p-type interlayer 21 creates a gradual transition from a layer with relatively small lattice constant (e.g., the electron blocking layer 20) to a layer with a relatively large lattice constant (e.g., the p-type contact layer 22).

To reduce the stress, any combination of one or more solutions can be utilized. For example, the p-type interlayer 21 can be configured to have an effective lattice constant that is between the lattice constants of the electron blocking layer 20 and the p-type contact layer 22. In an embodiment, the p-type interlayer 21 has a variable composition profile, such as a variable doping concentration, a variable aluminum content, and/or the like. The variable composition can be configured to provide a transition from a composition comparable to (e.g., the same as) the electron blocking layer 20 on a side of the p-type interlayer 21 adjacent to the electron blocking layer 20 to a composition comparable to the p-type contact layer 22 on a side of the p-type interlayer 21 adjacent to the p-type contact layer 22. In this manner, the effective lattice constant of the p-type interlayer 21 can change from a lattice constant comparable to that of the electron blocking layer 20 to a lattice constant comparable to that of the p-type contact layer 22, thereby resulting in an overall reduction of stress over that present when the p-type interlayer 21 is not included.

Furthermore, the p-type interlayer 21 can have a variable p-type dopant concentration. To this extent, as illustrated by the p-type doping profiles 42A, 42B, the p-type interlayer 21 can have a p-type dopant concentration that is comparable to the dopant concentration in the electron blocking layer 20 on the side of the p-type interlayer 21 adjacent to the electron blocking layer 20 and a p-type dopant concentration that is comparable to the p-type dopant concentration in the p-type contact layer 22 on the side of the p-type interlayer 21 adjacent to the p-type contact layer 22. The dopant concentration within the p-type interlayer 21 can transition from a lower dopant concentration to a higher dopant concentration using any solution. For example, the dopant concentration can continuously increase, increase at varying rates, increase in a stepwise manner, and/or the like. Furthermore, the transition can occur across all of a height of the p-type interlayer 21 and/or over only a portion of the height of the p-type interlayer 21.

In an embodiment, the p-type interlayer 21 can have a variable alloy composition. To this extent, the p-type interlayer 21 can have, for example, an aluminum content that varies from an aluminum content that is comparable to the aluminum content in the electron blocking layer 20 on the side of the p-type interlayer 21 adjacent to the electron blocking layer 20 and an aluminum content that is comparable to the aluminum content in the p-type contact layer 22 on the side of the p-type interlayer 21 adjacent to the p-type contact layer 22. The aluminum content within the p-type interlayer 21 can transition from a higher aluminum content to a lower aluminum content using any solution. For example, the aluminum content can continuously decrease, decrease at varying rates, decrease in a stepwise manner, and/or the like. Furthermore, the transition can occur across all of a height of the p-type interlayer 21 and/or over only a portion of the height of the p-type interlayer 21. In a more particular embodiment, the p-type interlayer 21 can comprise a group III nitride layer formed of $Ga_zIn_yAl_xB_{1-x-y-z}N$, where $0 \leq x, y, z \leq 1$, and $0 \leq x+y+z \leq 1$. Furthermore, the molar fractions x, y, z can change by at least five percent throughout the entire thickness of the p-type interlayer 21. The change in molar fraction(s) can be gradual and continuous corresponding to a graded layer. In an embodiment, the change can comprise a series of steps. For example, the electron blocking layer 20 can comprise a molar fraction of aluminum of 0.7 and the p-type interlayer 21 can be graded from the molar fraction of 0.7 to a molar fraction of 0.2 along its thickness (an overall change in the aluminum molar fraction of about 71%).

In the illustrative embodiments shown in FIGS. 3A and 3B, the p-type interlayer 21 includes a first portion adjacent to the electron blocking layer 20 in which the alloy composition transitions from a composition comparable to that of the electron blocking layer 20 to a composition comparable to that of the composition of the p-type contact layer 22 while the dopant concentration remains comparable to the dopant concentration in the electron blocking layer 20. Once the alloy composition in the interlayer 21 is comparable to that of the p-type contact layer 22, the interlayer 21 can include a second portion adjacent to the p-type contact layer 22 in which the dopant concentration transitions from a dopant concentration comparable to that of the electron blocking layer 20 to a dopant concentration comparable to that of the p-type contact layer 22. In this manner, the dopant concentration is not increased until the alloy composition in the p-type interlayer 21 is comparable to that of the p-type contact layer 22 (e.g., a low aluminum content). However, it is understood that this is only an illustrative configuration for the interlayer 21 and various other configurations are possible.

Figure 4:
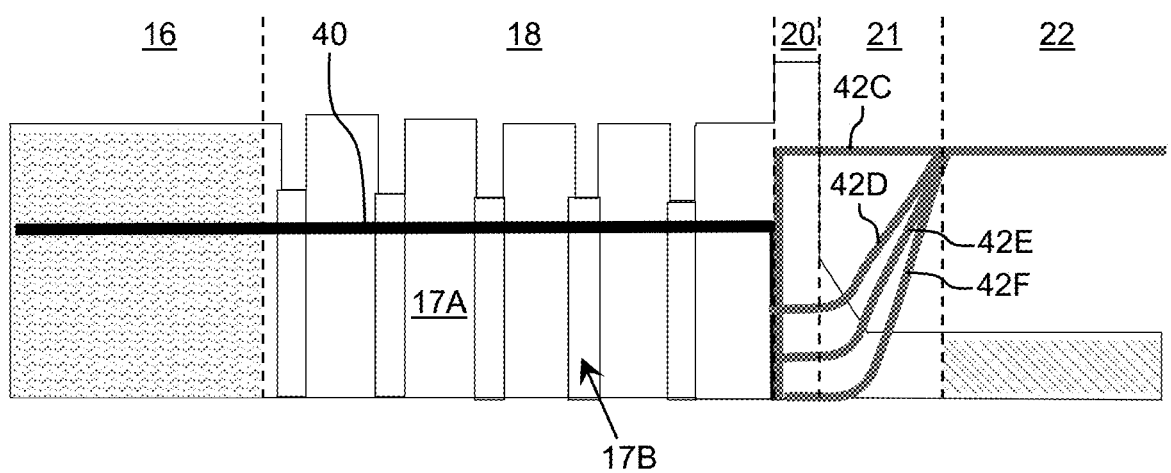
FIG. 4 shows illustrative composition profiles of the p-type side of an active region with differing dopant concentrations according to embodiments.

For example, FIG. 4 shows illustrative composition profiles, each with a unique p-type doping profile 42C-42F, of the p-type side of an active region 18 according to embodiments. As illustrated, the p-type interlayer 21, as well as the electron blocking layer 20 and the p-type contact layer 22, can have a substantially constant, comparable dopant concentration, as shown by doping profile 42C. Alternatively, as shown by doping profiles 42D-42F, the electron blocking layer 20 can have a dopant concentration that is lower than the dopant concentration of the p-type contact layer 22 (e.g., at least ten times lower), and the p-type interlayer 21 can have a varying dopant concentration that transitions from the lower dopant concentration to the higher dopant concentration. For each doping profile 42D-42F, the dopant concentration varies linearly and continuously in the portion of the p-type interlayer 21 adjacent to the p-type contact layer 22. Additionally, in each case, a dopant concentration comparable to the target dopant concentration within the p-type contact layer 22 is achieved in the interlayer 21. A specific doping profile can be optimized based on the thickness and the composition (e.g., the aluminum molar fraction) of the electron blocking layer 20, which in turn can be optimized for a particular configuration of the active region 18 using any solution.

Still further, an embodiment of the interlayer 21 can include a plurality of alternating tensile and compressive sublayers. Such a configuration can be fabricated, for example, by changes in an epitaxial growth procedure used to grow the interlayer 21. In an embodiment, the interlayer 21 is grown as shown and described in U.S. patent application Ser. No. 13/756,806, titled ""Epitaxy Technique for Reducing Threading Dislocations in Stressed Semiconductor Compounds," which was filled on 1 Feb. 2013, and which is hereby incorporated by reference. In this case, the compressive and tensile sublayers can be grown using a set of epitaxial growth periods. During each epitaxial growth period, a first semiconductor sublayer having one of: a tensile stress or a compressive stress is grown followed by growth of a second semiconductor sublayer having the other of: the tensile stress or the compressive stress directly on the first semiconductor sublayer. One or more of a set of growth conditions, a thickness of one or both of the sublayers, and/or a lattice mismatch between the sublayers can be configured to create a target level of compressive and/or shear stress within a minimum percentage of the interface between the sublayers. The target level of compressive and/or shear stress can be selected based on an amount of shear stress sufficient to turn a minimum set of dislocations in the interlayer 21 from a direction primarily in a direction of a c-axis to a direction primarily in a c-plane of the interlayer 21. The growth conditions adjusted to affect the tensile and compressive characteristics of layers can include a molar ratio of group V precursors to group III precursors (V/III ratio), growth temperature, gas flow, and/or the like. As used herein, a "tensile layer" is a layer experiencing tensile stress, and a "compressive layer" is a layer experiencing compressive stress.

Figure 5A:
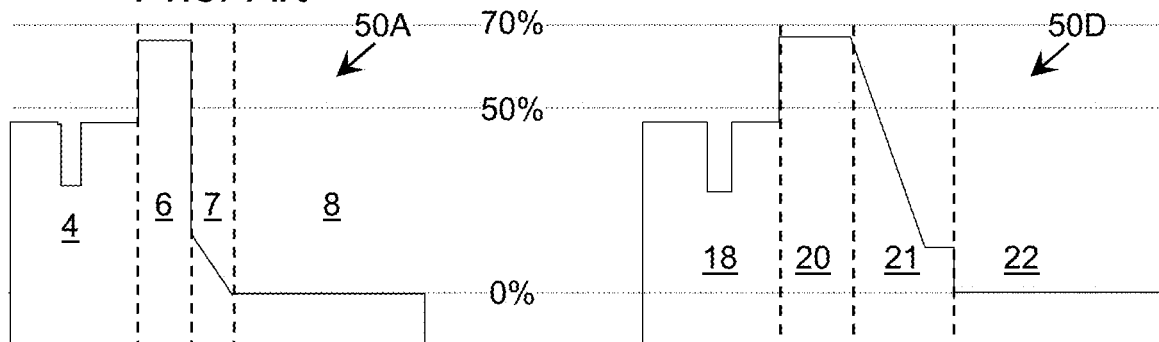
FIG. 5A shows a composition profile of the p-type side of an active region according to the prior art and FIGS. 5B-5F show illustrative composition profiles of the p-type side of an active region with differing alloy compositions according to embodiments.
Figure 5B:
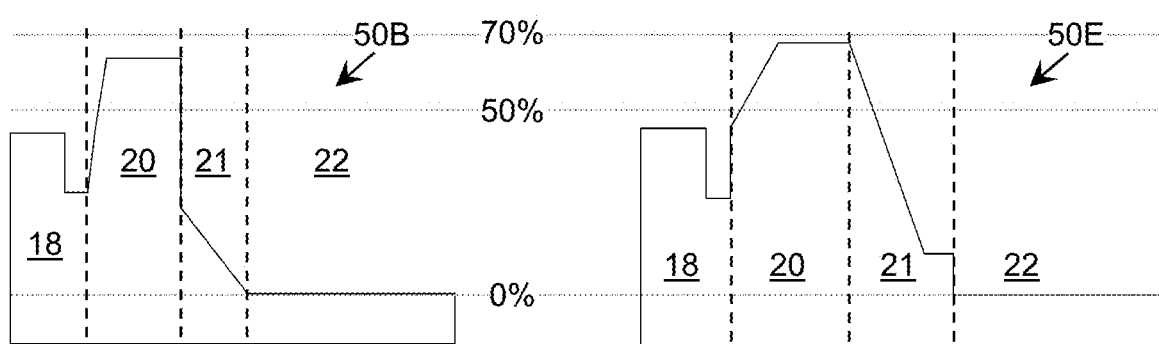
Figure 5C:
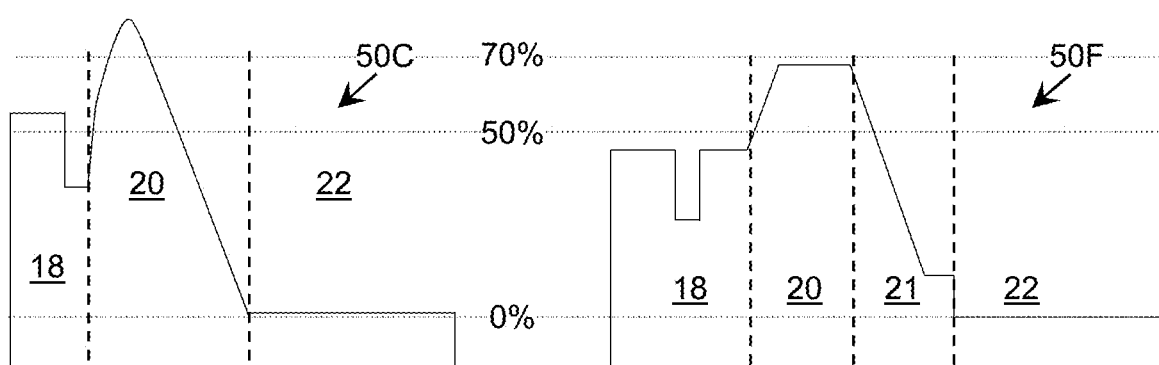
Figure 5D:
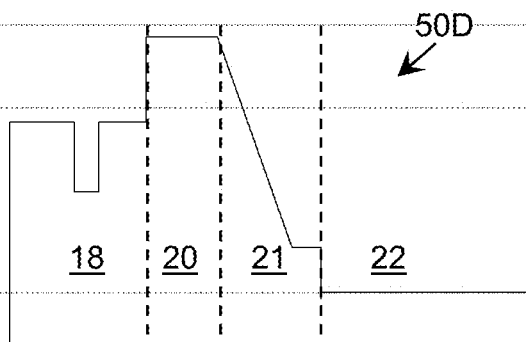
Figure 5E:
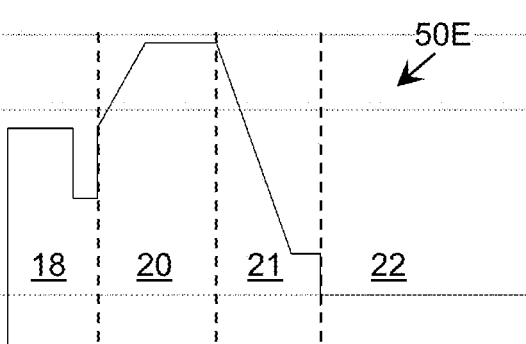
Figure 5F:
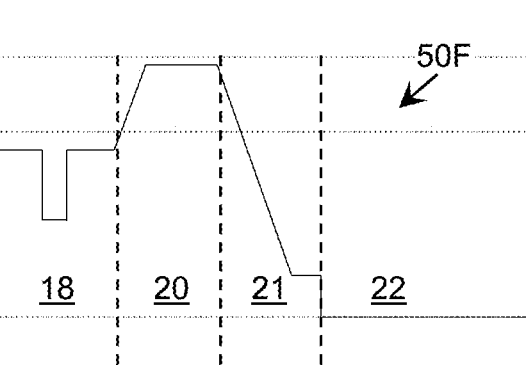
Figure 6A:
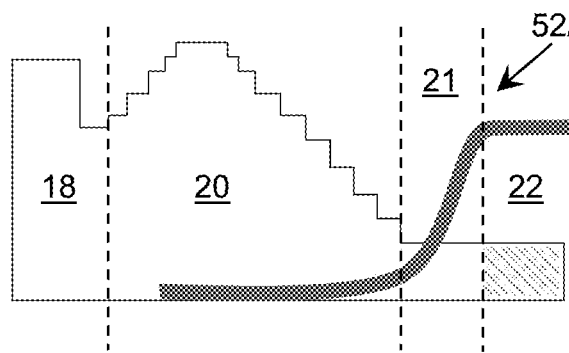
FIGS. 6A-6F show illustrative composition profiles of the p-type side of an active region with differing electron blocking layer and/or p-type interlayer compositions according to embodiments.
Figure 6D:
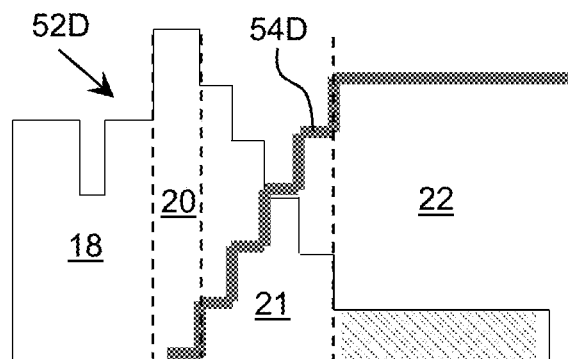
Figure 6B:
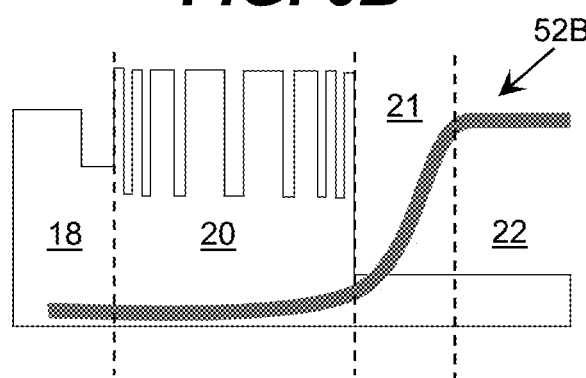
Figure 6E:
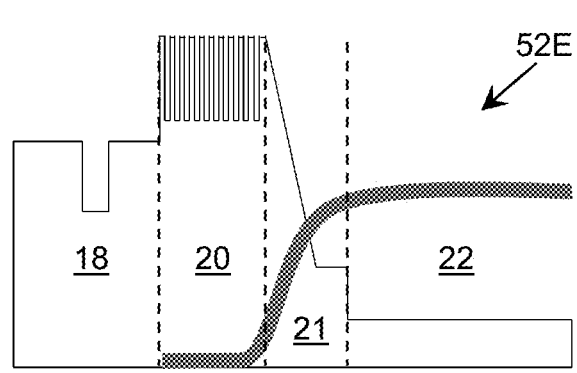
Figure 6C:
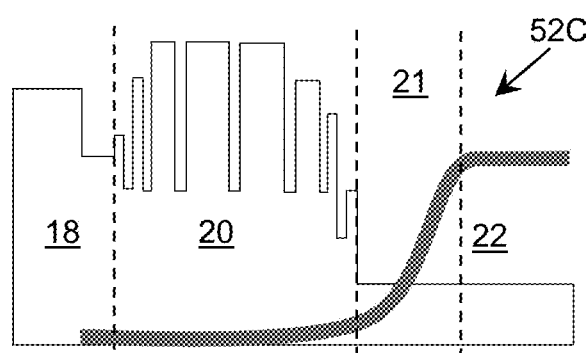
Figure 6F:
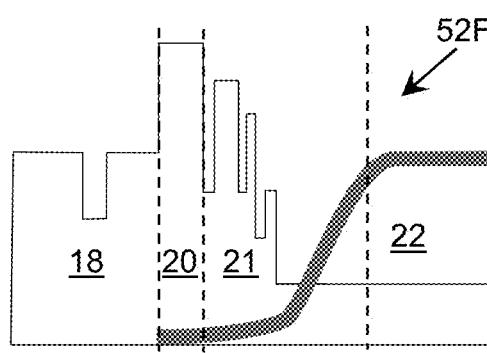

Various alternative alloy compositions also can be implemented according to embodiments. To this extent, FIG. 5A shows a composition profile 50A of the p-type side of an active region according to the prior art and FIGS. 5B-5F show illustrative composition profiles 50B-50F of the p-type side of an active region with differing alloy compositions according to embodiments. In each case, the composition profile 50A-50F is shown in conjunction with a percent of aluminum present in the corresponding group III-V material. In FIG. 5A, a quantum well (lower portion) between adjacent barriers is shown according to a prior art active region 4. On the p-type side of the active region 4, the heterostructure includes an electron blocking layer 6, a graded interlayer 7, and a p-type contact layer 8.

Embodiments described herein can alter one or more aspects of the p-type side composition profile of the heterostructure. For example, embodiments can include a graded transition between a composition in an active region 18 and a composition of an electron blocking layer 20. The graded transition can be configured to mediate stresses associated with a lattice mismatch between the electron blocking layer 20 and the last quantum well formed on the p-type side of the active region 18. Mediation of such stresses can increase a reliability of the heterostructure and resulting device. For example, during operation of a device, built in stresses can be relaxed through a dislocation generation process. Such dislocations lead to carrier capture and overall deterioration in the operation of the device. Insertion of a graded transition can reduce a number of dislocations formed through such a process.

Any of various graded transition solutions can be utilized. For example, the composition profile 50B illustrates an embodiment in which the graded transition is increased linearly, and starts from the composition of the last quantum well on the p-type side of the active region 18 going to the composition of the electron blocking layer 20. Similarly, the composition profile 50C illustrates an embodiment in which the graded transition is increased in a nonlinear manner from the composition of the last quantum well on the p-type side of the active region 18 to a peak level in the electron blocking layer 20. In the composition profile 50E, the graded transition begins after the last quantum well, but at a level corresponding to a barrier in the active region 18. In the composition profile 50F, the graded transition starts after the last barrier in the active region 18. It is understood that these embodiments are only illustrative of various solutions for forming a graded transition between the active region 18 and the electron blocking layer 20. In an illustrative embodiment, a grading rate can include a change of 0.1 in a molar fraction of aluminum over a thickness of few tens of nanometers (e.g., approximately thirty nanometers). The grading can be employed, for example, when an aluminum molar fraction of the electron blocking layer 20 is at least five percent higher than the corresponding molar fraction of the p-type contact layer 22.

Similarly, a heterostructure can include a graded transition between the electron blocking layer 20 and the p-type contact 22, which can reduce a lattice mismatch between the layers. For example, the composition profile 50B includes an interlayer 21 having a linearly graded transition, which starts at a composition approximately equal to a composition in a quantum well in the active region 18 and ends at the composition of the p-type contact 22. In the composition profile 50C, an entirety of the electron blocking layer 20 has a substantially continuously changing composition, which provides a reduced effective lattice constant for the electron blocking layer 20. As illustrated, the changing composition can be configured to provide a graded transition from a peak composition in the electron blocking layer 20 to the composition of the p-type contact 22. In each of the composition profiles 50D-50F, an interlayer 21 includes a first portion that have a linearly graded transition from that of the electron blocking layer 20 to an intermediate level, at which the composition remains in a second portion of the interlayer 21 prior to the p-type contact layer 22. Each of the composition profiles 50D-50F is shown including an intermediate composition at which the graded portion stops and which is different from the composition of the p-type contact layer 22. A sharp difference between the composition of the interlayer 21 and the p-type contact layer 22 may be included, for example, to yield generation of dislocations at the interface of the interlayer 21 and the p-type contact layer 22, which can result in relaxation of the p-type contact layer 22.

It is understood that for each of the illustrative composition profiles 50B-50F, a concentration of a p-type dopant in the electron blocking layer 20 can be significantly lower (e.g., at most ten percent) than the p-type dopant concentration in the p-type contact layer 22.

Various other solutions can be utilized to reduce the overall stresses associated with including an electron blocking layer 20 while preserving a good quality of the semiconductor heterostructure. For example, FIGS. 6A-6F show illustrative composition profiles 52A-52F of the p-type side of an active region 18 with differing electron blocking layer 20 and/or p-type interlayer 21 compositions according to embodiments. In each composition profile 52A-52F, an alloy composition of the electron blocking layer 20 and/or the p-type interlayer 21 is periodically or aperiodically adjusted in a manner to reduce the stresses present in the corresponding heterostructure.

The composition profile 52A illustrates an electron blocking layer 20 having a plurality of sublayers, each of which is defined by an alloy composition (e.g., aluminum molar fraction) that differs from the immediately adjacent sublayer(s). In an embodiment, the difference in alloy compositions, as expressed as the corresponding aluminum molar fractions, of two immediately adjacent sublayers is at least 0.5%. A maximum variation in composition can be determined based on the thicknesses of the sublayers. For example, for sublayers having thicknesses of a few nanometers, the sublayers can comprise substantially different compositions. However, thicker sublayers are limited to less abrupt changes in composition. In an embodiment, a maximum variation in composition and sublayer thickness are selected such as to not introduce additional dislocations within the electron blocking layer 20, e.g., by limiting a resulting stress times thickness of 5[GPAxnm].

As shown in the composition profile 52A, the sublayers can form a staircase compositional grading, which increases from the alloy composition of the last quantum well in the active region 18 to a peak alloy composition (e.g., an aluminum molar fraction of approximately 0.7) located in a central portion of the electron blocking layer 20 before forming a decreasing staircase compositional grading to an alloy composition of the p-type contact layer 22. In an embodiment, a thickness of each of the sublayers is in a range between approximately 0.5 nanometers and approximately 50 nanometers. In contrast to continuous compositional grading, use of a stepped (staircase) compositional grading can result in the formation of higher quality semiconductor layers for particular epitaxial growth methodologies. During epitaxial growth, a slow variation of growth parameters can be utilized to achieve high quality semiconductor layers, which is typically more difficult with continuous compositional grading which can result in non-uniformities within the layer.

The composition profiles 52B, 52C illustrate sublayers of an electron blocking layer 20 forming a superlattice, in which the sublayers alternate between a relatively high aluminum content and a relatively low aluminum content as compared to the immediately adjacent sublayer(s) in the electron blocking layer 20. In an embodiment, the aluminum molar fraction for sublayers having a relatively low aluminum content can be in a range between 0 to 0.6, while the aluminum molar fraction for sublayers having a relatively high aluminum content can be in a range between 0.1 and 1. Regardless, a difference between the corresponding aluminum molar fractions of two immediately adjacent sublayers can be at least 0.5% with the difference in compositions being selected such that dislocations are not formed within the sublayers. In the composition profile 52B, the sublayers alternate between a high aluminum molar fraction and a low aluminum molar fraction, both of which remain substantially constant across a height of the electron blocking layer 20.

Variation in the high and/or low aluminum molar fractions can alter stresses present within the electron blocking layer 20. In the composition profile 52C, the high aluminum molar fractions gradually increase from lower molar fractions to the highest molar fractions in a central portion of the electron blocking layer 20 before gradually decreasing to lower molar fractions closer to the p-type contact layer 22. The low aluminum molar fractions remain substantially constant across the electron blocking layer 20 until going lower close to the p-type contact layer 22. However, it is understood that the low aluminum molar fractions can vary in a manner similar to that shown for the high aluminum molar fractions. In an embodiment, a relative difference between the aluminum molar fractions of similar neighboring high/low aluminum molar fraction sublayers is at least 0.5%.

In addition, the thicknesses of the sublayers in an electron blocking layer 20 can change throughout the layer 20. Altering the thicknesses of sublayers can provide additional control over an effective lattice constant of the electron blocking layer 20, which can result in additional control over the stresses in the layer 20. For example, as illustrated in the composition profiles 52B, 52C, a thickness of the sublayers having the high aluminum molar fractions gradually increase from the outer portions of the electron blocking layer 20 to the central portion of the electron blocking layer 20. In contrast, the thickness of the sublayers having the low aluminum molar fractions can remain substantially constant. In an embodiment, a thickness of a sublayer differs from a thickness of at least one other sublayer by at least 1% with the difference in compositions being selected such that dislocations are not formed within the sublayers. In another embodiment, neighboring high aluminum content sublayers differ in thickness by at least 1%. In yet another embodiment, the neighboring sublayers with low aluminum content differ in thickness by at least 1%. In still another embodiment, the thicknesses of the high aluminum content sublayers increase towards a central portion of the electron blocking layer 20, while the thicknesses of the low aluminum content sublayers decreases towards the central portion of the electron blocking layer 20, with the difference in thicknesses of neighboring sublayers with similar aluminum content is at least 1%. It is understood that these configurations of sublayer thicknesses are only illustrative, and an embodiment of an electron blocking layer 20 can have any of various combinations of sublayer thicknesses.

It is understood that the illustrative aluminum molar fraction variations shown in the composition profiles 52A-52C can be combined with any of various other features and/or implemented in another layer, such as the interlayer 21. For example, the composition profile 52D shows an interlayer 21 having a plurality of sublayers, each of which is defined by an alloy composition (e.g., aluminum molar fraction) that differs from the immediately adjacent sublayer(s). In an embodiment, the difference in alloy compositions, as expressed as the corresponding aluminum molar fractions, of two immediately adjacent sublayers is at least 0.5%. As shown in the composition profile 52D, the sublayers can form a staircase compositional grading, which decreases from the alloy composition of the electron blocking layer 20 to an alloy composition of the p-type contact layer 22. In an embodiment, a thickness of each of the sublayers is in a range between approximately 0.5 nanometers and approximately 50 nanometers.

Similarly, the composition profile 52D shows a staircase doping profile 54D for the doping concentration in the interlayer 21, which increases in steps from the doping concentration of the electron blocking layer 20 to a doping concentration of the p-type contact layer 22. In an embodiment, the steps of the compositional grading and doping concentration are located in the same location within the interlayer 21. However, it is understood that this is only illustrative, and the steps can be misaligned or only some of the steps can be aligned. Similarly, while the compositional grading and doping concentration are shown including the same number of steps, it is understood that a different number of steps can be utilized for each.

The composition profile 52E illustrates a superlattice alloy composition for the electron blocking layer 20 combined with a graded composition for the interlayer 21. In particular, the interlayer 21 includes two sublayers, with one sublayer having a continuously decreasing composition and the other sublayer having a constant composition. It is understood that the superlattice alloy composition for the electron blocking layer 20 is only illustrative and an alternative superlattice configuration, such as those shown in composition profiles 52B, 52C, can be used in conjunction with the graded interlayer 21. The composition profile 52F illustrates an interlayer 21 having a superlattice-type decreasing alloy composition. As illustrated, a thickness of the high aluminum content sublayers can decrease with distance from the electron blocking layer 20.

FIGS. 6A-6F also show an illustrative inverse dependence of the doping profile and the alloy composition (e.g., aluminum molar fraction). In an embodiment, the proportionality constant between the doping and the aluminum molar fraction can be selected so that the doping concentration is in the range of approximately $10^{18}$ to approximately $10^{20}$ dopants per cubic centimeter when the aluminum molar fraction is zero. In another embodiment, when the aluminum molar fraction is between approximately 0.5 to approximately 0.7, the doping concentration can be at most 10% of the doping concentration at zero aluminum molar fraction. In an embodiment, a dependence between the doping concentrations on the inverse value of the aluminum molar fraction is linear.

Figure 7A:
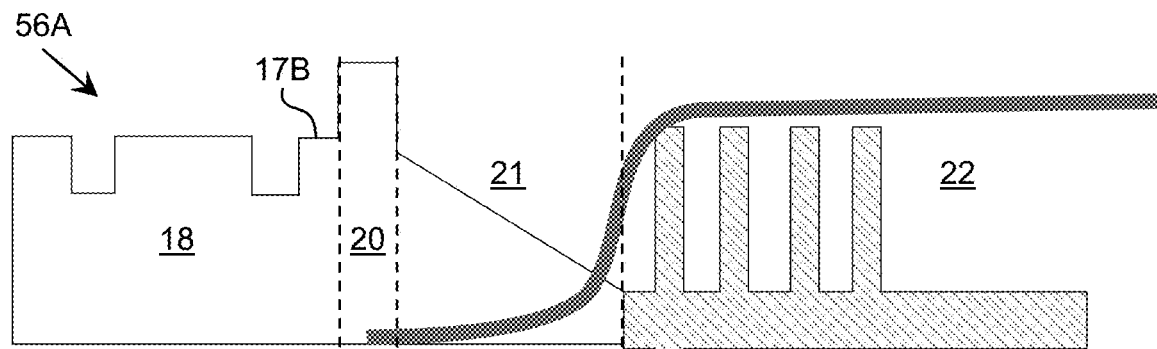
FIGS. 7A and 7B show illustrative composition profiles of a p-type contact layer according to embodiments.
Figure 7B:
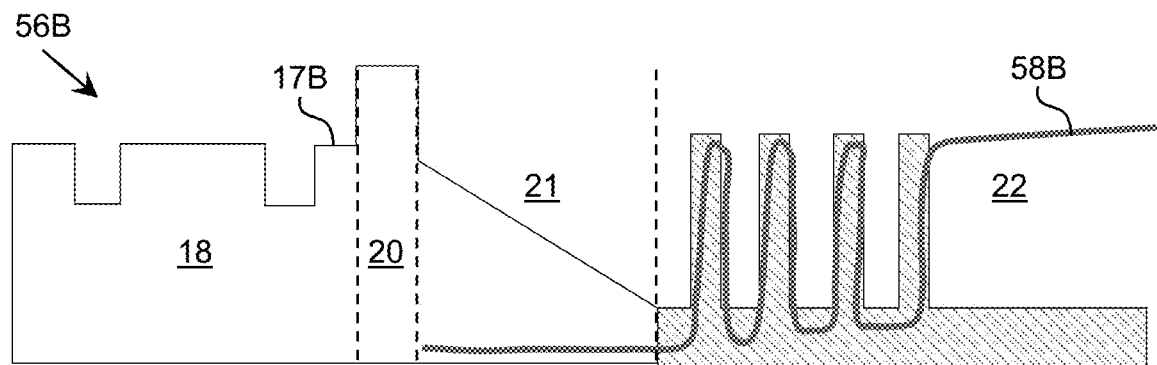

Variation in aluminum molar fractions and/or doping concentration also can be implemented in the p-type contact layer 22. To this extent, FIGS. 7A and 7B show illustrative composition profiles 56A, 56B of a p-type contact layer 22 according to embodiments. In each composition profile 56A, 56B, the p-type contact layer 22 is shown including a plurality of sublayers with alternating high and low aluminum molar fractions, thereby forming a superlattice adjacent to the interlayer 21. Inclusion of a superlattice can improve transparent and/or reflective properties of the p-type contact layer 22. Additionally, in the composition profile 56B, the p-type contact layer 22 is shown having a modulated doping profile 58B that alternates between high and low doping concentrations in the sublayers. The modulated doping profile 58B can improve hole mobility and/or promote ionization of acceptors. As illustrated, the doping concentrations and aluminum molar fractions can be adjusted at substantially the same time such that the doping concentrations and aluminum molar fractions are both concurrently high or low. In this case, the high aluminum molar fraction sublayers of the superlattice (e.g., the barriers) can be highly p-type doped, while the low aluminum molar fraction sublayers of the superlattice (e.g., the quantum wells) can be lightly p-type doped. However, it is understood that this is only illustrative of various possible embodiments. In an illustrative embodiment, the superlattice in a composition profile 56A, 56B is an $Al_xGa_{1-x}N/Al_yGa_{1-y}N$ superlattice. In a more particular illustrative embodiment, a width of the sublayers can be few nanometers, and a difference in molar fraction of the sublayers can be as much as 1, but preferably less than 0.5.

In an embodiment, one or more of the electron blocking layer 20, p-type interlayer 21, or p-type contact layer 22 has a laterally inhomogeneous alloy composition and/or doping concentration, which is configured to improve conductivity while maintaining a relatively low absorption of electromagnetic radiation. For example, an embodiment of a layer 20, 21, 22 can be configured as shown and described in U.S. patent application Ser. No. 13/572,446, titled "Emitting Device with Compositional and Doping Inhomogeneities in Semiconductor Layers," which was filed on 10 Aug. 2012, and which is hereby incorporated by reference. In this case, one or more layers can include lateral regions configured to facilitate the transmission of radiation through the layer and lateral regions configured to facilitate current flow through the layer. The layer can comprise a short period superlattice, which includes barriers alternating with wells. In this case, the barriers can include both transparent regions, which are configured to reduce an amount of radiation that is absorbed in the layer, and higher conductive regions, which are configured to keep the voltage drop across the layer within a desired range.

For example, the p-type interlayer 21 and/or the p-type contact layer 22 can have a non-uniform lateral dopant concentration and/or non-uniform lateral composition. In one embodiment, dopant concentration is at least 5% different between highs and lows of the dopant concentration landscape, wherein the dopant concentration landscape is referred to dopant concentration as a function of lateral (i.e., the plane of the layer that is substantially parallel with the surface of the layer adjacent to another layer of the heterostructure) x, y coordinates of the corresponding layer 21, 22. Similarly, in an embodiment, the electron blocking layer 20, the p-type interlayer 21, or the p-type contact layer 22 may have non-uniform composition in the lateral direction. For example, the change in aluminum molar fraction of the layer 20, 21, 22 can be at least kT (measured at room temperature, ~0.026 eV) between highs and lows of the aluminum molar fraction landscape, wherein the aluminum molar fraction landscape is referred to aluminum molar fraction as a function of lateral x, y coordinates of the corresponding layer 20, 21, 22.

The inventors propose a scaling solution in order to determine a target doping concentration that will maintain a minimum reliability for a new optoelectronic device being designed. In particular, using known attributes of a model optoelectronic device having an acceptable reliability and a similar heterostructure (e.g., a heterostructure including one or more corresponding layers as the new optoelectronic device formed using comparable materials) with different size dimensions, the scaling solution can be used to determine a doping concentration that will provide a similar (e.g., the same) level of reliability for the new optoelectronic device having different dimensions, e.g., a different lateral area and/or thickness of the p-type contact layer 22.

For example, assume a p-type contact layer of the model optoelectronic device has a doping concentration, $N_0$, a lateral p-type contact area, $A_0$, and a p-type contact layer thickness, $d_0$. An average number of collisions that an electron makes in traversing a scatterer, ν, is given by:

$$\nu = \sigma N_0 d_0,$$

where σ is a scattering cross section of the acceptor (e.g., magnesium). For a flux of electrons with a current density, $J_0$, an average number of collisions per unit area, $f_0$, is given by:

$$f_0 = J_0 \sigma N_0 d_0.$$

Consider a new optoelectronic device having a lateral p-type contact area, A, a p-type contact layer thickness, d, and a requirement that the total current, I, remains the same as in the model optoelectronic device. In this case, the following equation applies:

$$I = J \times A = J_0 \times A_0.$$

The average number of collisions per unit area, f, for the new optoelectronic device is given by:

$$f = J \sigma N d,$$

and $f \leq f_0$, to maintain the reliability of the model optoelectronic device in the new optoelectronic device. In this case, we can determine that:

$$JNd \leq J_0 N_0 d_0 \rightarrow \frac{I}{A} Nd \leq \frac{I}{A_0} N_0 d_0 \rightarrow N \leq N_0 \left(\frac{A}{A_0}\right)\left(\frac{d_0}{d}\right).$$

The expression above provides a scaling algorithm of a target doping concentration in order to meet reliability constraints of the new optoelectronic device. In particular, the expression indicates that the dopant concentration of the new optoelectronic device should scale as the area ratio of the new p-type contact layer to the model p-type contact layer, and scale inversely to the thickness ratio of the new p-type contact layer to the model p-type contact layer.

As illustrated in composition profiles 56A, 56B, the active region 18 can include a last barrier 17B, which can be followed by an electron blocking layer 20. The last barrier 17B can have a thickness that is different from a thickness of other barriers located in the active layer 18. In an embodiment, the last barrier 17B is thinner than the other barriers in the active layer 18. In a more particular embodiment, the last barrier 17B is at least 1.5 times thinner than the other barriers in the active layer 18.

FIGS. 8A-8E show illustrative band gap diagrams corresponding to illustrative heterostructures for optoelectronic devices according to embodiments. While the figures show various illustrative configurations of heterostructures and the layers located therein, it is understood that these configurations are included for clarity. To this extent, it is understood that a heterostructure described herein can include additional or fewer layers not shown, layer(s) having different configurations than that shown, and/or the like. For example, embodiments of a heterostructure described herein can include a combination of features shown and described in conjunction with different figures.

Figure 8A:
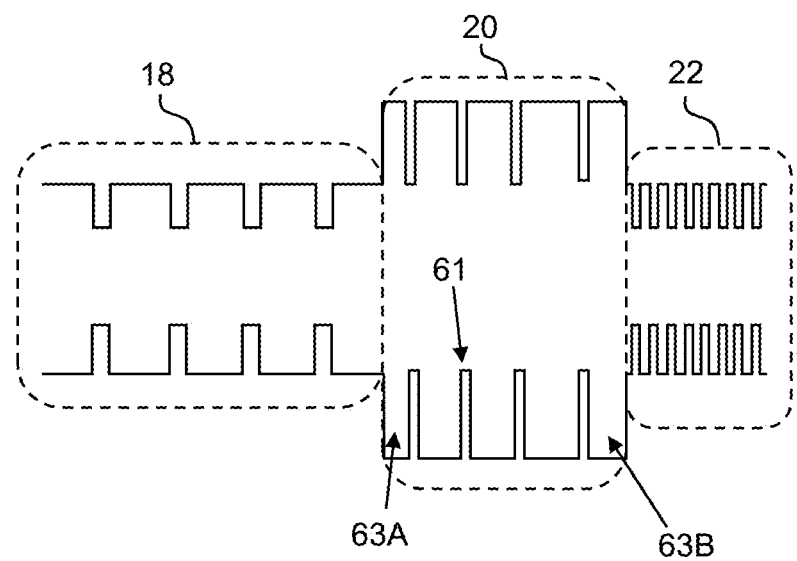
FIGS. 8A-E show illustrative band gap diagrams corresponding to illustrative heterostructures for optoelectronic devices according to embodiments.

In FIG. 8A, the heterostructure is shown including an active layer 18, an electron blocking layer 20, and a p-type contact layer 22. The electron blocking layer 20 is shown including a plurality of thin sublayers 61, each having a band gap significantly smaller than a band gap of the remaining electron blocking layer 20. The sublayers 61 create a plurality of electron blocking layer regions 63A, 63B. As illustrated, each electron blocking layer region 63A, 63B can have the same band gap as the other electron blocking layer regions 63A, 63B. Additionally, each sublayer 61 can have the same band gap as the other sublayers 61, which can be comparable to the band gap of the last barrier in the active region 18 prior to the electron blocking layer 20. However, it is understood that other configurations with varying band gaps can be implemented.

In an embodiment, the smaller band gaps of the sublayers 61 result from forming the sublayers 61 with a composition having a lower AlN molar fraction than that of the electron blocking layer regions 63A, 63B. For example, the electron blocking layer regions 63A, 63B can have an AlN molar fraction in a range of 0.6-0.9, while the sublayers 61 can have an AlN molar fraction in a range of 0.5-0.75. In a more particular embodiment, such as when the heterostructure is used for a deep ultraviolet light emitting diode, the electron blocking layer regions 63A, 63B can have an AlN molar fraction in a range of 0.7-0.85. Regardless, a difference between the AlN molar fractions of the electron blocking layer regions 63A, 63B and the sublayers 61 can be in a range of 0.01-0.2 and in a more particular embodiment between 0.05-0.1. In an embodiment, each sublayer 61 can have a AlN molar fraction that is substantially the same as the AlN molar fraction of the last barrier in the active region 18.

In an embodiment, each sublayer 61 can have a thickness in a range of 1-5 nanometers, while a thickness of each of the electron blocking layer regions 63A, 63B can be in a range of 5-20 nanometers. The electron blocking layer regions 63A, 63B can have different thicknesses across the electron blocking layer 20. It is understood that the electron blocking layer regions 63A, 63B can have any variation in thicknesses across the electron blocking layer 20 as shown and described herein. In an embodiment, variation in the thicknesses of the electron blocking layer regions 63A, 63B can be at least 1.5 times. For example, a first electron blocking layer region 63A (e.g., the electron blocking layer region nearest to the active region 18) can have a first thickness, while a second electron blocking layer region 63B (e.g., the electron blocking layer region furthest from the active region 18) can have a thickness at least 1.5 times that of the first electron blocking layer region 63A.

Figure 8B:
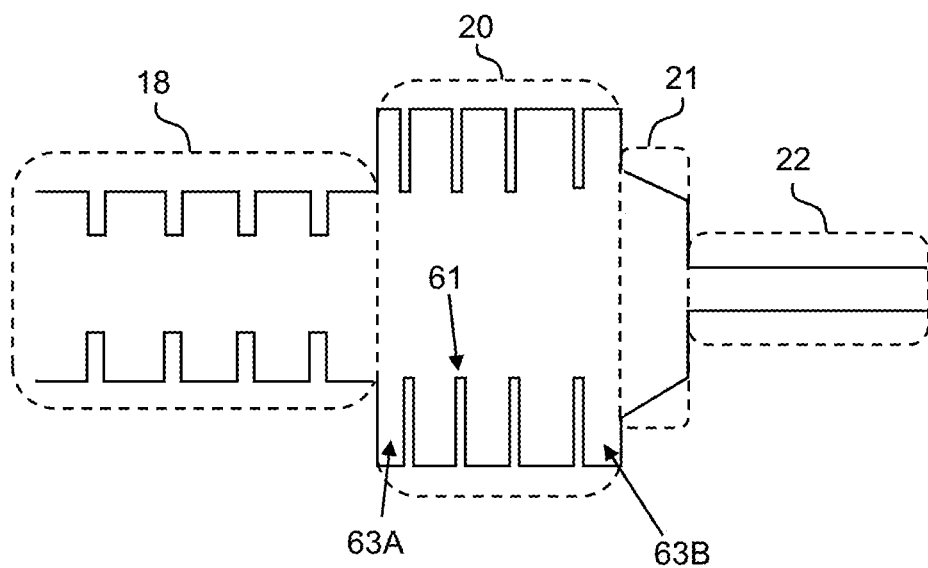

In FIG. 8B, the heterostructure is also shown including a p-type interlayer 21 located between the electron blocking layer 20 and the p-type contact layer 22. The interlayer 21 can have a variable composition which results in a variable band gap. For example, the interlayer 21 can have a composition with an AlN molar ratio decreasing from a side adjacent to the electron blocking layer 20 to a side adjacent to the p-type contact layer 22. In this manner, the interlayer 21 can provide a transition between the band gaps of the electron blocking layer 20 and the p-type contact layer 22. However, the interlayer 21 can have a different composition (e.g., AlN molar fraction), and therefore a different band gap, than that of either the electron blocking layer 20 or the p-type contact layer 22. Such discontinuities can lead to relaxation of one or more of the layers, such as partial or complete relaxation of the p-type interlayer 21 and/or the p-type contact layer 22. In an embodiment, a change in the AlN molar fraction at the interface between the interlayer 21 and the p-type contact layer 22 is at least 0.1 for inducing relaxation in the p-type contact layer 22. In a more particular embodiment, the difference is at least 0.2. In an embodiment, the p-type contact layer 22 can be formed of a low band gap material, such as GaN. In an embodiment, the p-type contact layer 22 can have a lattice constant that is substantially the same as an effective lattice constant of a free standing p-type contact layer 22 of the same composition.

Figure 8C:
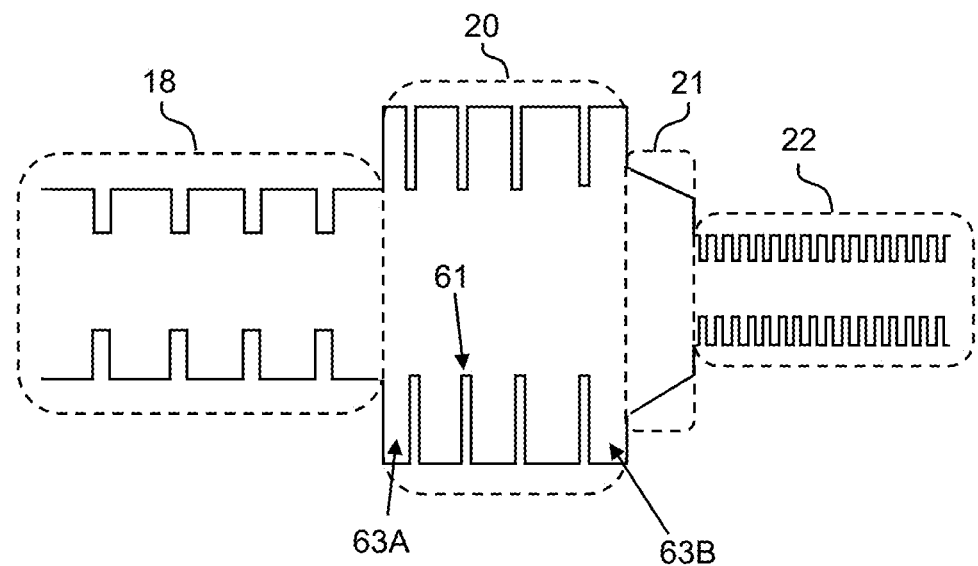

In FIG. 8C, the heterostructure is shown including a p-type contact layer 22 having a short period superlattice (SPSL). For example, the p-type contact layer 22 can comprise a short period superlattice formed of pairs of $Al_{x1}Ga_{1-x1}N/Al_{x2}Ga_{1-x2}N$ with the typical thickness of the resulting quantum wells and barriers in the short period superlattice being in the range of 0.5-5 nm. In an embodiment, the short period superlattice forming the p-type contact layer 22 can be configured to provide improved transparency over that of GaN, without a significant reduction in the conductivity of the p-type contact layer 22. For example, the short period superlattice forming the p-type contact layer 22 can comprise semiconductor layers (e.g., $Al_xGa_{1-x}N/Al_yGa_{1-y}N$, where x y) that result in an overall transparency of the p-type contact layer 22 of at least 30% to target radiation at normal incidence to the p-type contact layer 22. The target radiation is radiation either emitted from the active region 18 or absorbed by the active region 18, and is determined by the configuration of quantum wells (their composition and thicknesses) within the active region 18. In an embodiment, the target radiation is deep ultraviolet radiation. As shown in FIG. 12C, the discontinuity in the band gap at the interface between the interlayer 21 and the p-type contact layer 22 can be maintained for partial relaxation of the short period superlattice forming the p-type contact layer 22.

Figure 8D:
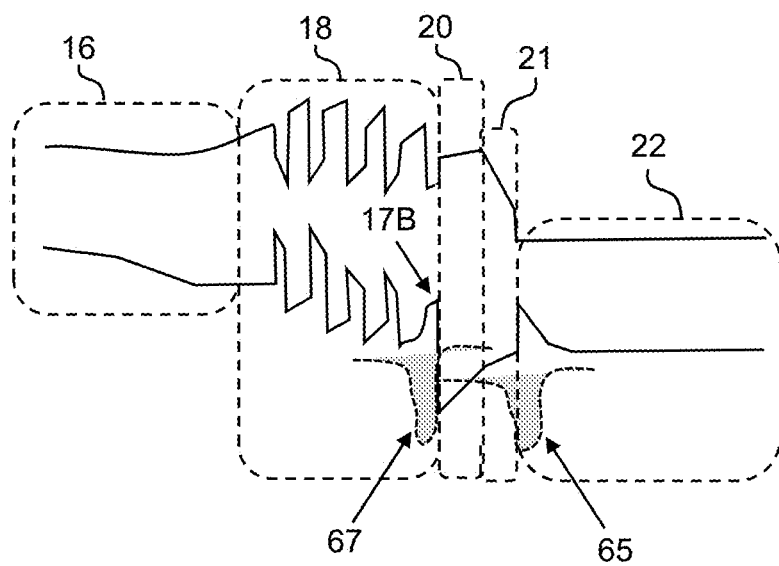

FIG. 8D shows a band diagram of an illustrative optoelectronic device according to another embodiment. In this case, the discontinuity in composition between the interlayer 21 and the p-type contact layer 22 results in polarization fields, which leads to band bending and an increase in a carrier charge density 65 at the interface. A similar band bending and increase in a carrier charge density 67 also is present at a quantum well 17B located closest to the electron blocking layer 20. In an embodiment, a discontinuity of an AlN molar fraction at the interface of the interlayer 21 and the p-type contact layer 22 is configured to result in the carrier charge density 65 being comparable to (i.e., on the same order of magnitude) or less than the carrier charge density 67.

In an illustrative design of a deep ultraviolet light emitting diode, the last quantum well 17B is the most important quantum well for emission or absorption of radiation during operation of the optoelectronic device. In an embodiment, the remaining quantum wells in the active region 18 can be configured to optimize stress, and as a result piezo-polarization present within the quantum well 17B, e.g., to improve reliability and/or efficiency of operation of the device. For example, the quantum wells in the active region 18 other than the quantum well 17B can be configured to result in a piezo-electric field that leads to a minimized overall polarization field within the quantum well 17B. In particular, the quantum well 17B can have a composition and thickness selected based on a target wavelength of radiation (e.g., to be emitted or sensed by a corresponding optoelectronic device). However, one or more of the other quantum wells in the active region can have a composition and/or thickness that differs from that of the quantum well 17B and is selected to reduce an overall polarization field within the quantum well 17B. In an embodiment, the stresses within the quantum well 17B do not exceed 0.5 GPA compressive stress, although some compressive stress can be present within the quantum well 17B. It is understood that embodiments of the active region 18 described herein can include any number of quantum wells. In an embodiment, the active region 18 includes no more than five quantum wells (i.e., 1-5 quantum wells).

Figure 8E:
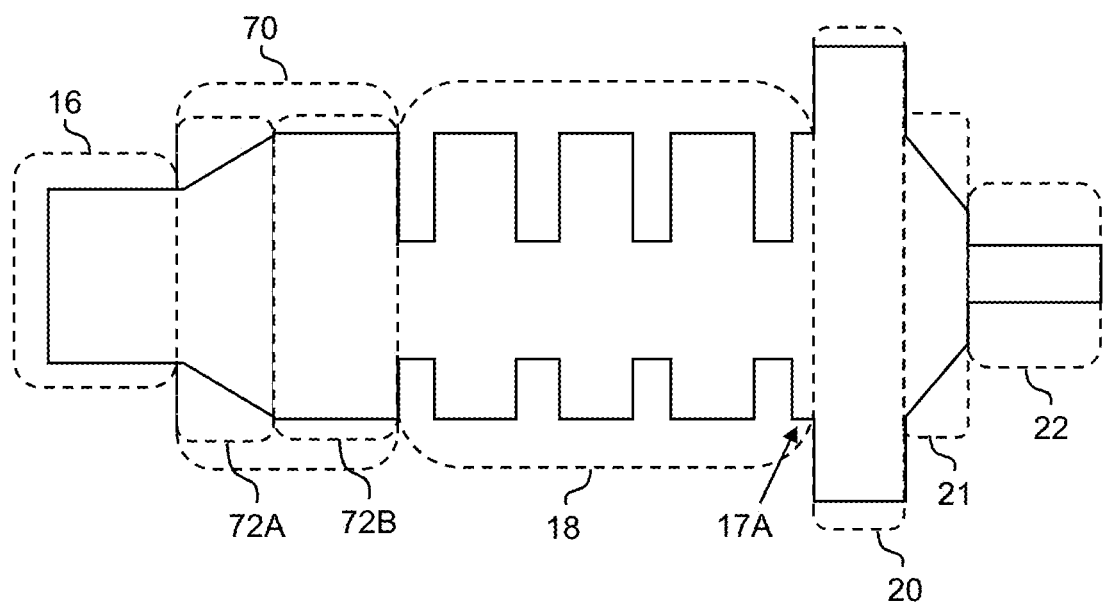

FIG. 8E shows an illustrative embodiment in which a n-type interlayer 70 is located between the n-type layer 16 and the active region 18. In a more particular embodiment, the n-type interlayer 70 can include a first sublayer 72A which has a variable composition and a second sublayer 72B having a constant composition. The variable composition sublayer 72A can have a varying composition (e.g., a varying AlN molar fraction) that results in a band gap that transitions from the band gap of the n-type layer 16 to the band gap of the constant composition sublayer 72B. For example, the variable composition sublayer 72A can have an AlN molar fraction that increases from the n-type layer 16 to the constant composition sublayer 72B. In an embodiment, the n-type contact layer 16 can have a lattice constant that is between the lattice constant of AlN and an effective lattice constant of a free standing n-type contact layer 16 of the same composition.

The constant composition sublayer 72B can have a band gap that is comparable to the band gaps of the barriers in the active region 18. In an embodiment, a thickness (along a growth direction, which is left to right in the drawing) of the constant composition sublayer 72B can be larger than the thicknesses of each of the barriers in the active region 18. Additionally, the active region 18 can include a last barrier 17A that has a thickness that is smaller than the thicknesses of the remaining barriers in the active region 18. For example, the remaining barriers in the active region 18 can have a thickness in a range of 5-20 nanometers, while the last barrier 17A can have a thickness at least 1.5 times smaller.

In an embodiment, each of the n-type contact layer 16, n-type interlayer 70, the electron blocking layer 20, and the p-type contact layer 22 can be formed of an AlGaN composition. For example: the n-type contact layer 16 can be formed of $Al_{x1}Ga_{1-x1}N$; the n-type interlayer 70 can be formed of $Al_{x2(z)}Ga_{1-x2(z)}N$, where the molar fraction x2(z) is a function of a thickness of the n-type interlayer 70; and the electron blocking layer 20 can be formed of $Al_{x3(z)}Ga_{1-x3(x)}N$, where the molar fraction x3(z) is a function of a thickness of the electron blocking layer 20; and the p-type contact layer 22 can be formed of $Al_{x4}Ga_{1-x4}N$. In an embodiment, the various molar fractions can be related. For example, the molar fraction x2(z) can be always greater than the molar fraction x1. Additionally, a maximum value of x3(z) can be greater than x2 and x4. Furthermore, a p-type interlayer 21 can be formed of an $Al_{x5}(z)Ga_{1-x5}$ mN, where the molar fraction x5(z) is a function of a thickness of the p-type interlayer 21. In this case, the molar fraction x5(z) can be larger than x4 at the corresponding interface with the p-type contact layer 22, and smaller than x3(z) at the corresponding interface with the electron blocking layer 20.

Figure 9B:
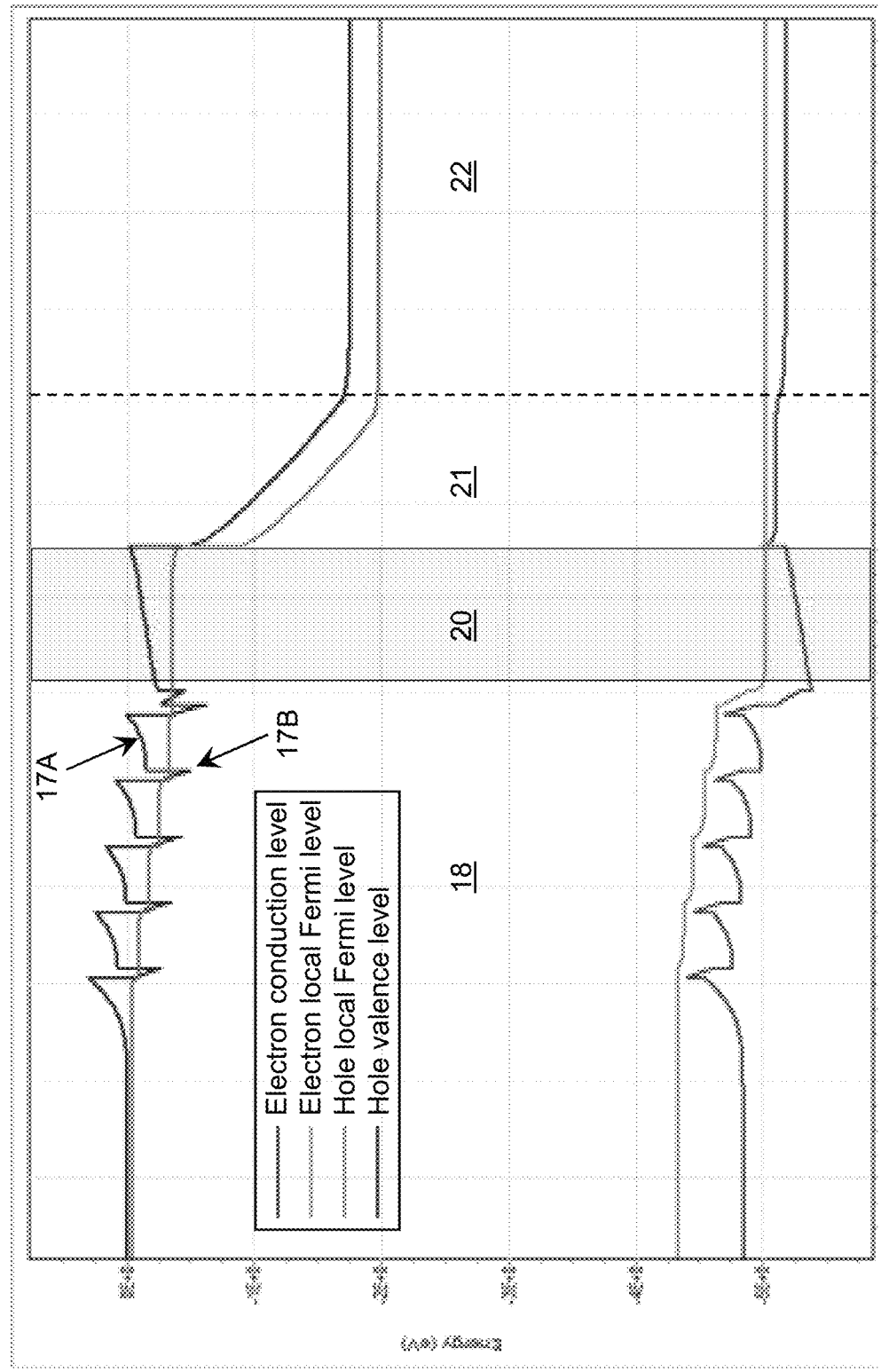
Figure 9C:
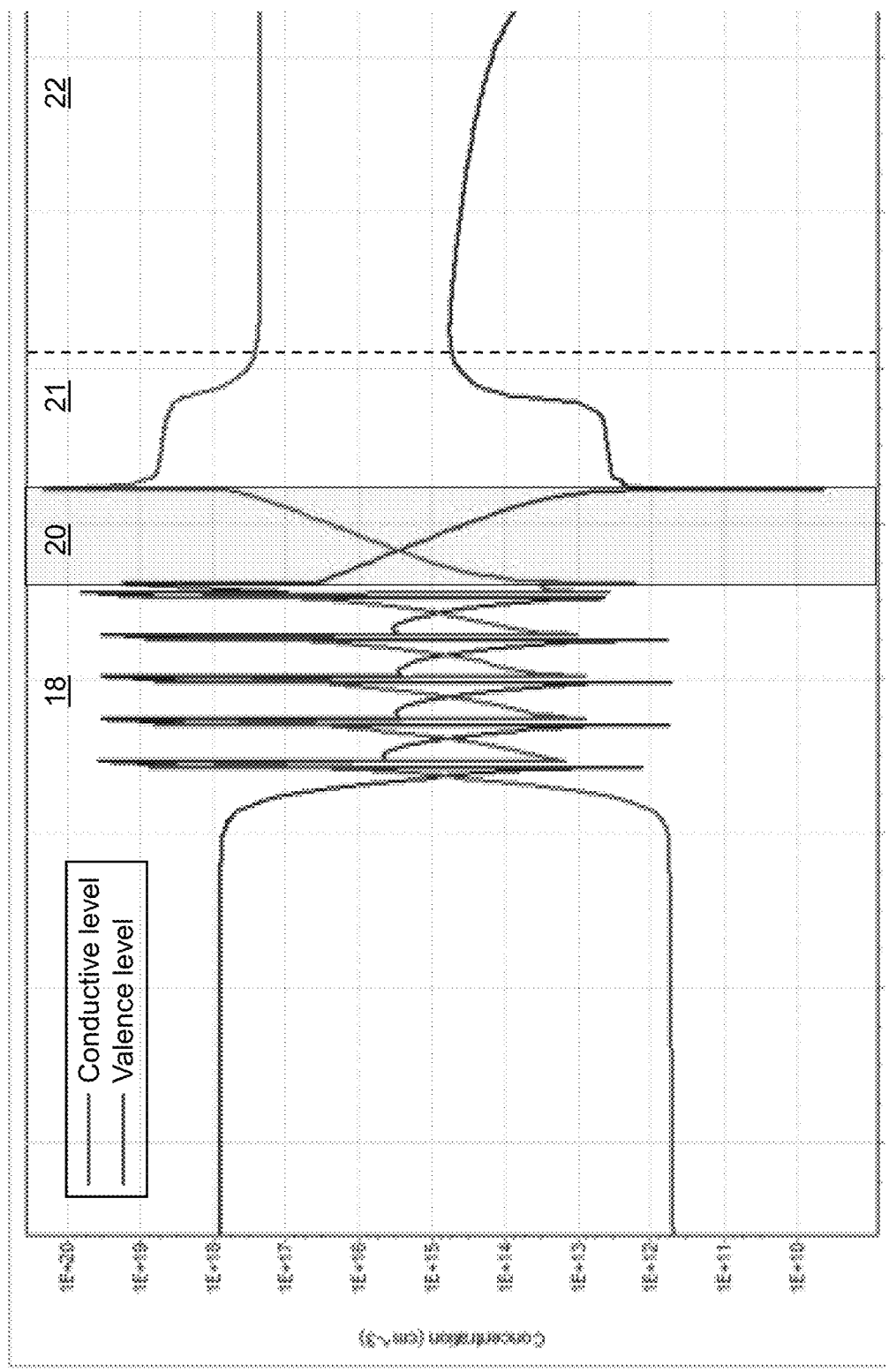

An electron blocking layer 20 can act as a significant barrier to holes, thereby reducing a concentration of holes in the active region 18. For example, FIGS. 9A-9C show a zero bias band diagram, a five volt bias band diagram, and a carrier concentration diagram for an illustrative heterostructure including an electron blocking layer 20 according to an embodiment. In particular, as shown in the band diagrams of FIGS. 9A and 9B, the heterostructure includes: an active region 18 with five quantum wells 17B separated by barriers 17A; an electron blocking layer 20; an interlayer 21; and a p-type contact layer 22. The electron blocking layer 20 can have an aluminum molar fraction in the range of 0.5-0.8, and can be 5-100 nm thick. In one embodiment the electron blocking layer 20 has an aluminum molar fraction x=0.7 and is several tens of nanometers thick. As illustrated by FIG. 9B, when under a bias of five volts, the electron blocking layer 20 provides a significant barrier to holes entering the active region 18 as shown by an abrupt change in band gap between the electron blocking layer 20 and the interlayer 21.

Figure 10B:
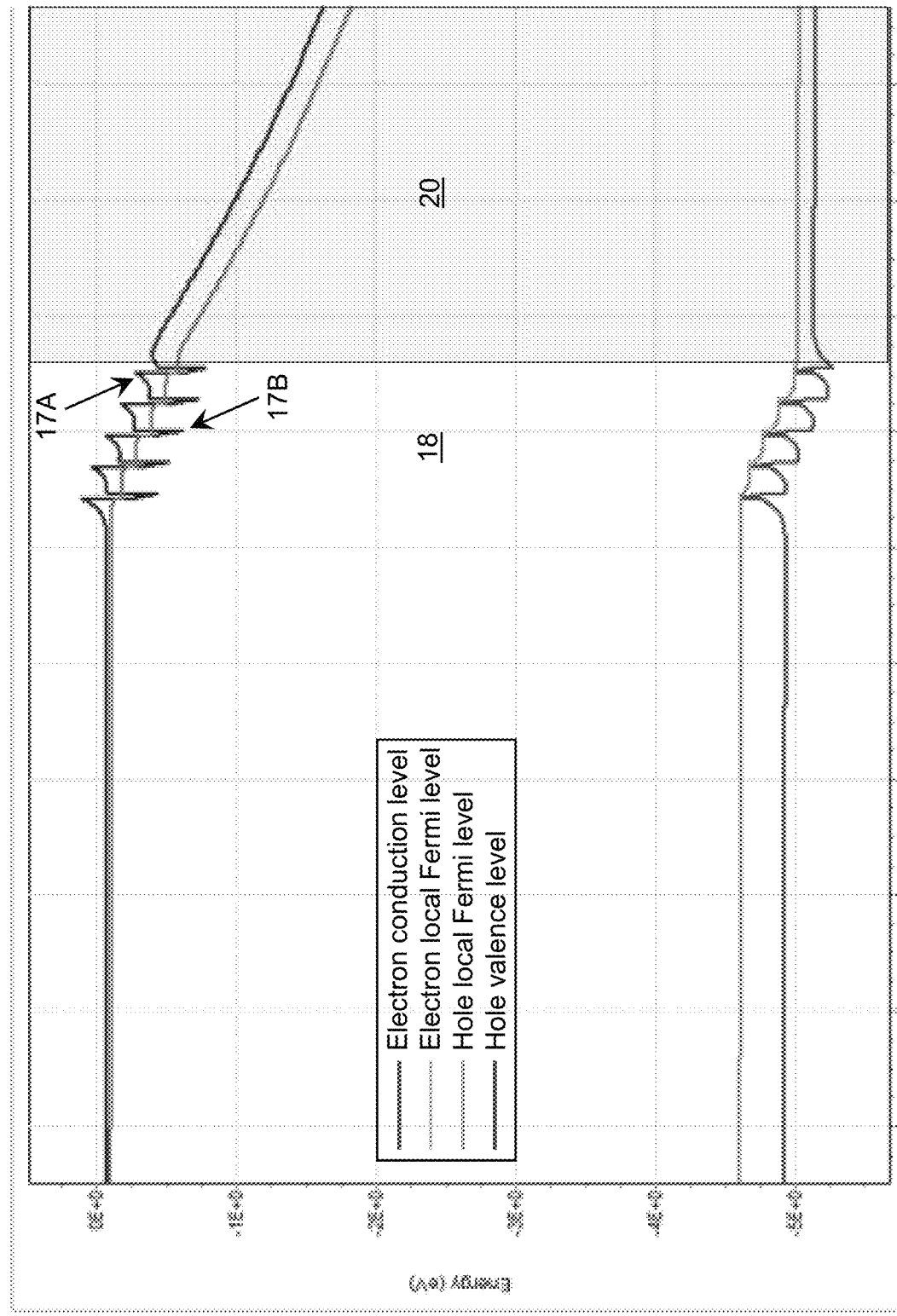
Figure 10C:
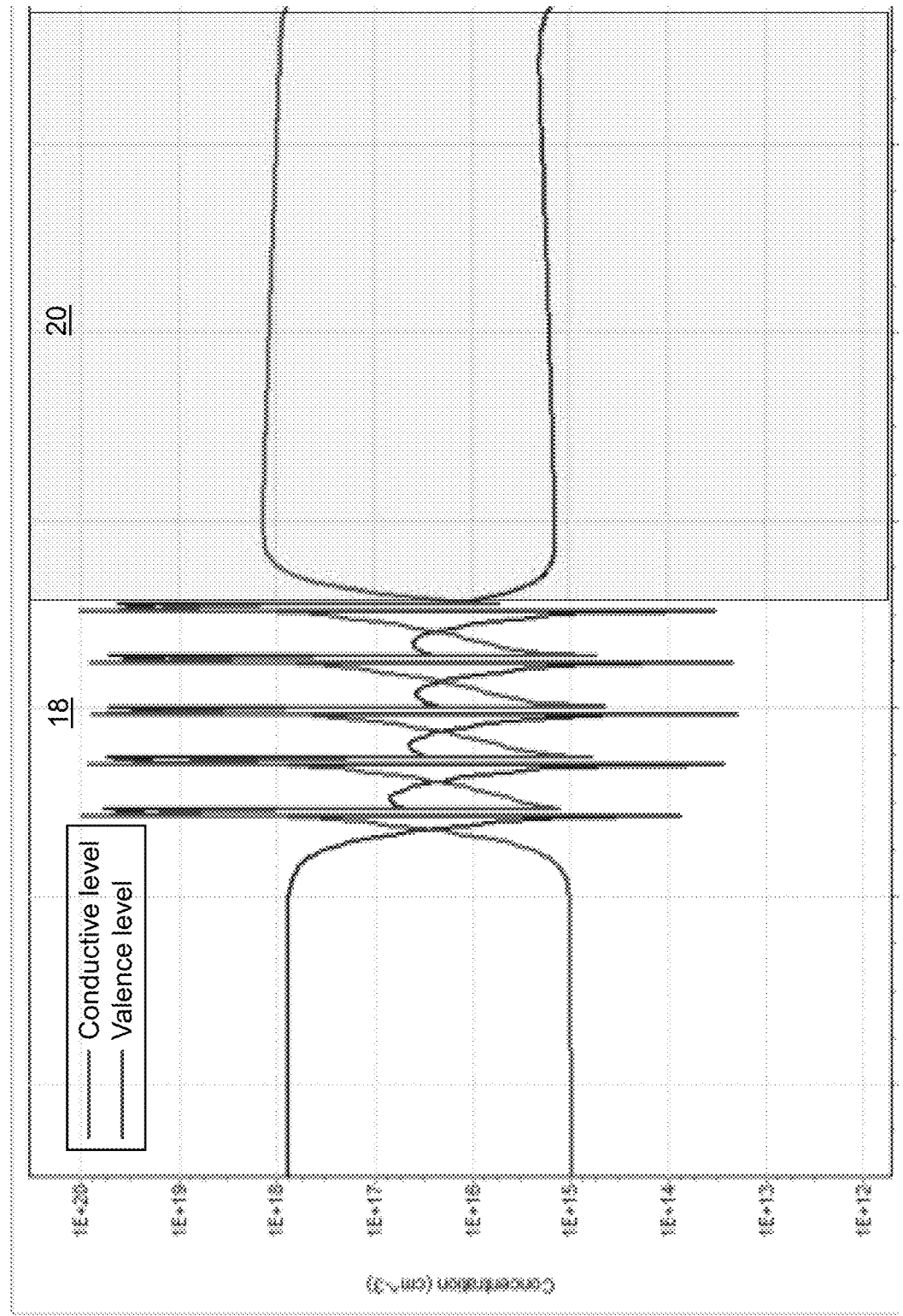

In an embodiment, the barrier for the holes provided by the electron blocking layer 20 is reduced by grading the electron blocking layer 20. To this extent, FIGS. 10A-10C show a zero bias band diagram, a five volt bias band diagram, and a carrier concentration diagram for an illustrative heterostructure including a graded electron blocking layer 20 according to an embodiment. As illustrated by FIG. 10B, the graded electron blocking layer 20 does not produce a significant barrier for holes. To this extent, by comparing the carrier concentration diagrams of FIGS. 9C and 9C, the graded electron blocking layer 20 increases the concentration of holes in the quantum well adjacent to electron blocking layer 20 by an order of magnitude.

Figure 11B:
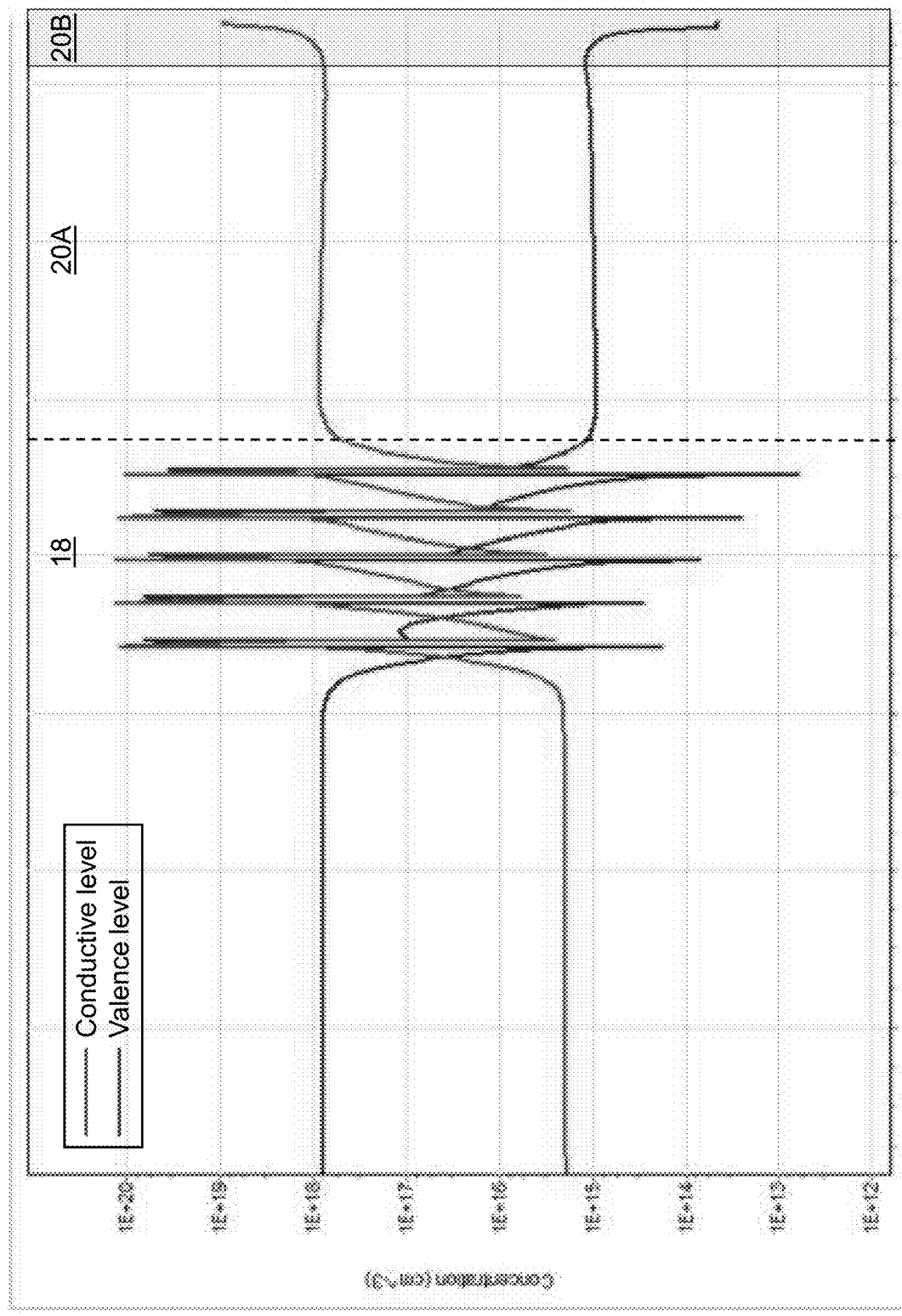

However, the graded electron blocking layer 20 can reduce electron injection current due to a reduced barrier for electrons. In an embodiment, the graded electron blocking layer 20 includes two distinct graded regions. For example, FIGS. 11A and 11B show a five volt bias band diagram and a carrier concentration diagram for an illustrative heterostructure including a graded electron blocking layer with two distinct graded regions 20A, 20B according to an embodiment. The first graded region 20A comprises a relatively slow grading with a total compositional change in the molar fraction of aluminum on the order of 0.3 for a graded region 20A having a thickness on the order of one hundred nanometers. The second graded region 20B can have a significantly higher grading, such as a total compositional change in the molar fraction of aluminum on the order of 0.3 for a graded region 20A having a thickness on the order of five to fifty nanometers. It is understood that a portion of the increased hole concentration shown in FIG. 11B is caused by polarization doping resulting from the grading. Additionally, a large concentration of holes (e.g., approximately $1 \times 10^{19}$ $cm^{-3}$) is present in the graded region 20B, where the grading is significant.

It is understood that the grading described herein in conjunction with the p-type layers 20, 21, 22 can be combined with forming a superlattice in a region of the layer. For example, the superlattice can have barriers which are graded throughout the superlattice region, e.g., each successive barrier within a superlattice region is either smaller or higher in aluminum molar fraction that the preceding barrier, these superlattice configurations can be referred to as a down-graded superlattice based on barriers or an up-graded superlattice based on barriers, respectively. In an embodiment, the successive barrier has an aluminum molar fraction that is at least 1% lower or higher than the molar fraction of the previous barrier. Additionally, it is understood that a quantum well height can be made progressively smaller or higher in a superlattice.

Figure 12A:
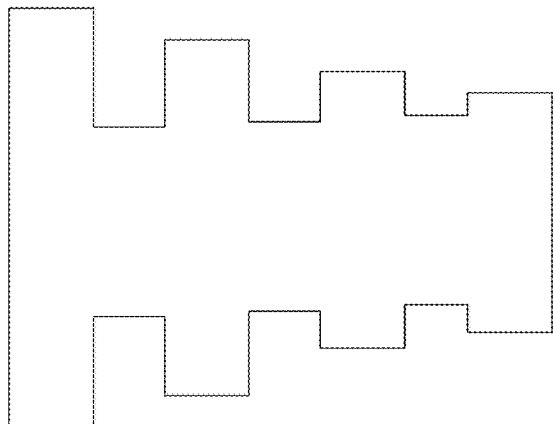
FIGS. 12A-12D show band gap diagrams corresponding to illustrative superlattice configurations according to embodiments.
Figure 12C:
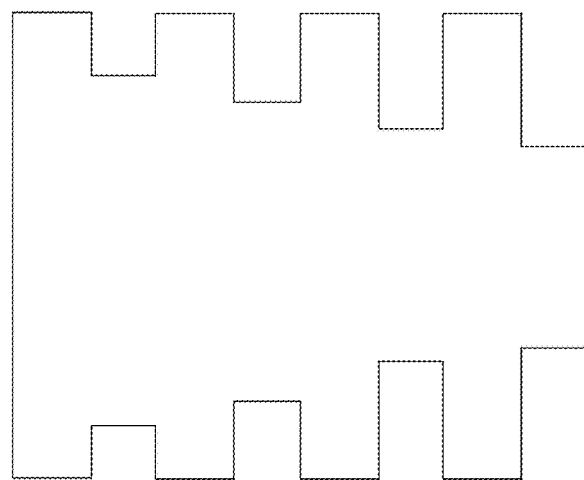
Figure 12B:
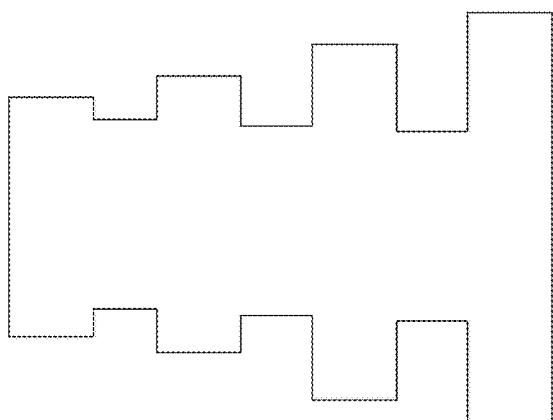
Figure 12D:
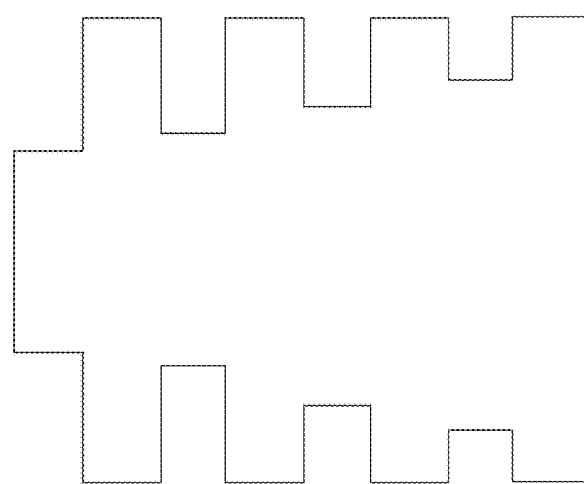

FIGS. 12A-12D show band gap diagrams corresponding to each of the illustrative superlattice configurations according to embodiments. In particular, FIG. 12A shows a down-graded superlattice based on barriers; FIG. 12B shows an up-graded superlattice based on barriers; FIG. 12C shows a down-graded superlattice based on quantum wells; and FIG. 12D shows an up-graded superlattice based on quantum wells. Still further, while variations in barrier or quantum well heights are shown, it is understood that configurations including varying barrier and quantum well heights and/or varying barrier and/or quantum well thicknesses can be utilized.

While the interlayer 21 is primarily described as having a different p-type doping and/or different semiconductor alloy composition from both of the electron blocking layer 20 and the p-type contact layer 22, it is understood that other solutions can be utilized to provide the interlayer 21 with different physical properties than those of the electron blocking layer 20 and the p-type contact layer 22. For example, the p-type interlayer 21 can be grown using a different growth morphology than those used in growing the electron blocking layer 20 and the p-type contact layer 22. For example, the growth morphology for the interlayer 21 can differ by one or more of: growth conditions (e.g., V/III ratio, temperature, and/or the like); an effective lattice constant; a presence of defects; and/or the like.

Figure 13A:
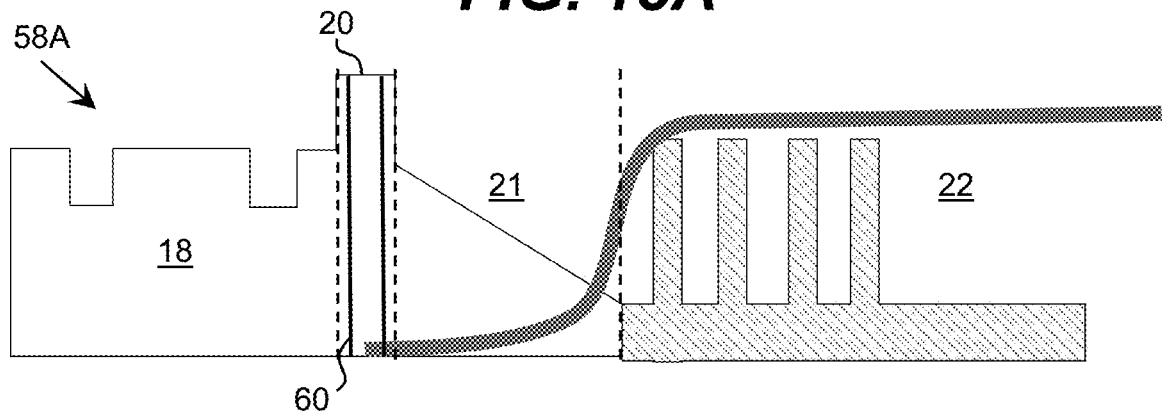
FIGS. 13A and 13B show illustrative composition and doping profiles of a p-type contact layer according to embodiments.
Figure 13B:
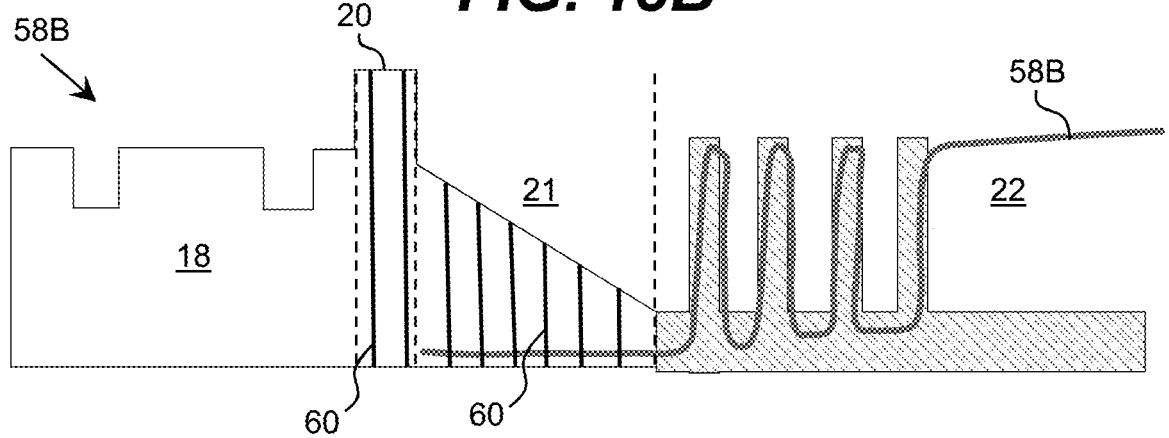

FIGS. 13A and 13B show illustrative composition and doping profiles of a p-type contact layer 22 according to embodiments. The p-type contact layer 22 can include a plurality of sublayers with alternating high and low aluminum molar fractions to form a superlattice, similar to the p-type contact layer 22 shown in FIGS. 7A and 7B. However, in the embodiment shown in FIG. 13A, the electron blocking layer 20 can include a plurality of very thin sublayers 60. In the embodiment shown in FIG. 13B, both the electron blocking layer 20 and the p-type interlayer 21 can include the plurality of thin sublayers 60. However, it is understood an embodiment also can comprise only the p-type interlayer 21 including the sublayers 60.

In an embodiment, a thickness of each of the plurality thin sublayers 60 is at most 1 nanometer (nm). The plurality of thin sublayers 60 can include a single atomic plane, or include a few atomic planes. For example, the plurality of thin sublayers 60 can include five or fewer atomic planes. In an embodiment, each of the plurality of thin sublayers 60 can form a layer of discontinuous islands and/or a layer with openings. A distance between each of the plurality of thin sublayers 60 can be selected to be smaller than a critical distance for the creation of threading dislocations in the region between each of the plurality of thin sublayers 60. The critical distance can be evaluated analytically from the energy balance calculations based on the lattice mismatch parameter for the corresponding semiconductor forming the electron blocking layer 20 and/or the p-type interlayer 21. The spacing between the plurality of thin sublayers 60 does not have to be uniform and can be varied. Regardless, in an embodiment, the spacing between each adjacent pair of thin sublayers 60 is smaller than the critical distance for the creation of threading dislocations. The plurality of thin sublayers 60 can help to manage the stresses within the electron blocking layer 20 and/or the p-type interlayer 21.

The plurality of thin sublayers 60 can comprise AlN layers, or layers with a wide bandgap that contain a large molar fraction of aluminum. In an embodiment, the sublayers 60 can comprise $Al_xGa_{1-x}N$ or $Al_xIn_yBn_zGa_{1-x-y-z}N$, where the molar fractions x, y, and z are chosen to yield a band gap of the sublayer 60 that is higher than a band gap of the surrounding material (e.g., the electron blocking layer 20 or the p-type interlayer 21). In an embodiment, the band gap of at least one of the plurality of thin sublayers 60 is at least 1 eV higher than the bandgap of the surrounding material (e.g., the material of the electron blocking layer 20 or the material of the p-type interlayer 21). Alternatively, in an embodiment, the lattice constant of the plurality of thin sublayers 60 is selected to be smaller than the lattice constant of the surrounding material. If the lattice constant of the plurality of thin sublayers 60 is given by As, the lattice constant of surrounding material is given by Ab and the lattice constant of AlN is Al, then in an embodiment, As<0.8*Ab+0.2*Al. In another embodiment, the plurality of thin sublayers 60 can include an aluminum molar fraction that is at least 10% higher than the aluminum molar fraction within electron blocking layer 20. It is understood that the plurality of thin sublayers 60 can be selected to vary in composition and/or thickness throughout the entire structure. In an embodiment, the composition of the plurality of thin sublayers 60 can be different from one sublayer to another. In another embodiment, the spacing between each of the plurality of thin sublayers 60 can change from one pair of adjacent sublayers to another. For example, the plurality of thin sublayers 60 in the electron blocking layer 20 can be different than the plurality of thin sublayers 60 in the p-type interlayer 21. In an embodiment, the plurality of thin sublayers 60 can be n-type doped with a dopant concentration between approximately $10^{17}$ to approximately $10^{19}$ dopants per centimeter. The n-type dopant can include, for example, Si dopants, and/or the like.

In an embodiment, the plurality of thin sublayers 60 can include GaN rich sublayers that have a narrower band gap than the surrounding material. For example, GaN rich sublayers can be introduced into a layer, such as the electron blocking layer 20, the p-type interlayer 21, and/or the p-type contact layer 22. In an embodiment, the GaN rich sublayers can comprise $Al_xGa_{1-x}N$ or $Al_xIn_yBn_zGa_{1-x-y-z}N$, where the molar fractions x, y, and z are chosen to yield a band gap that is narrower than the band gap of the surrounding material (e.g., the material of layers 20, 21, or 22). In an alternative embodiment, the lattice constant of the GaN rich sublayer is selected to be smaller than the lattice constant of the surrounding material. If the lattice constant of a sublayer is given by As, the lattice constant of the surrounding material is given by Ab, and the lattice constant of GaN is Ag, then in an embodiment As >0.8*Ab+0.2*Ag. The GaN rich sublayers can also be introduced to control the stresses within the electron blocking layer 20, where the composition, width, and spacing of the GaN rich sublayers depends upon the device wavelength and the thickness of the layers 20, 21, 22. The GaN sublayers can be heavily doped with a p-type (Mg) dopant concentration of at least approximately $5 \times 10^{19}$ dopants per cubic centimeter. The GaN sublayers can be grown in a temperature range of approximately 950 degrees Celsius to approximately 1050 degrees Celsius. Similar to the AlN layers, GaN sublayers can include a single atomic plane, or include a few atomic planes. For example, the GaN sublayers can include five or fewer atomic planes. Regardless, in each embodiment, the plurality of thin sublayers 60 are spaced throughout the electron blocking layer 20 (FIG. 13A), or the electron blocking layer 20 and the p-type interlayer 21 (FIG. 13B), to reduce stress and to not create additional dislocations. In an embodiment, the plurality of thin sublayers 60 are spaced in a way as to not cause formation of any additional dislocations due to lattice mismatch between the plurality of thin sublayers 60 and the electron blocking layer 20.

Figure 14A:
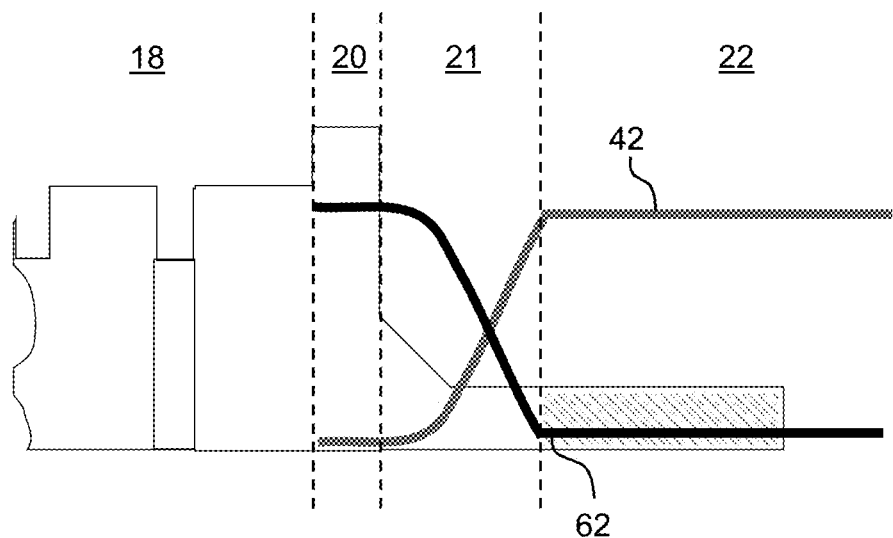
FIGS. 14A and 14B show illustrative composition doping and temperature profiles for forming a p-type contact layer according to embodiments.
Figure 14B:
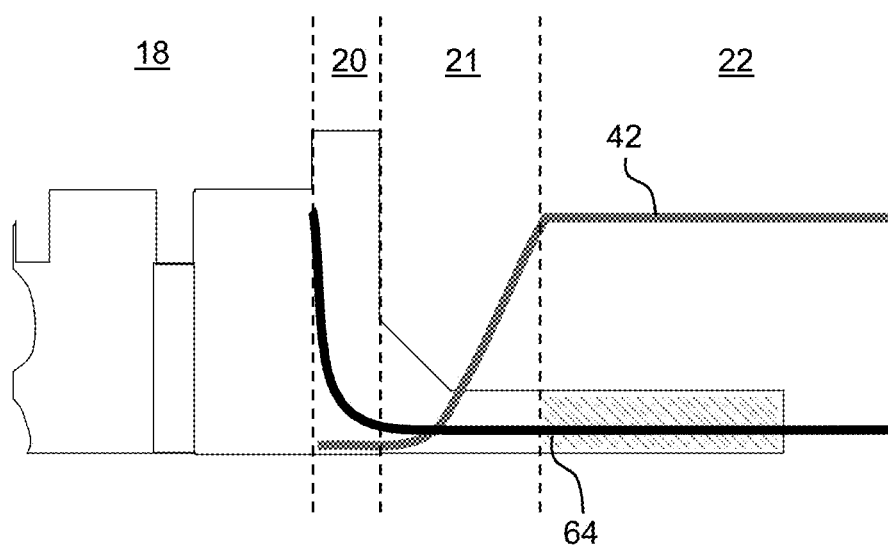

FIGS. 14A and 14B show illustrative composition doping and temperature profiles for growth of a p-type contact layer 22 according to embodiments. During the epitaxial growth of the p-type layers 20, 21, 22, the p-type doping and the temperature used for epitaxial growth can be varied. In the embodiment shown in FIG. 14A, in addition to increasing the p-type doping profile 42, the temperature is decreased as shown by the temperature profile curve 62. The temperature can be approximately 1000 degrees Celsius to approximately 1150 degrees Celsius for epitaxial growth of the electron blocking layer 20, and decrease during growth of the p-type interlayer 21, and reach its lowest value of approximately 850 degrees Celsius to 1050 degrees Celsius after growth of the p-type interlayer 21 and the start of growth of the p-type contact layer 22. It is understood that the temperature profile 62 shown in FIG. 14A only corresponds to a particular embodiment and that other embodiments including different temperature profiles are possible.

In an embodiment, the p-type contact layer 22 is grown in a temperature range of approximately 950 degrees Celsius to approximately 1050 degrees Celsius. In another embodiment, the p-type contact layer 22 is grown in a temperature range of approximately 950 degrees Celsius to approximately 1020 degrees Celsius. In yet another embodiment, if the electron blocking layer 20 is grown at a temperature T1 range, the p-type interlayer 21 is grown at a temperature T2 range, and the p-type contact layer 22 is grown at a temperature T3 range. In an embodiment, the high and low values of the T2 range is at least 1% lower than the T1 and T3 range. For example, the temperature when growing the p-type layer 21 can be lower than the temperature when growing the electron blocking layer 20 and the p-type contact layer 22.

In another embodiment, the T1 and T2 ranges are non-overlapping ranges and the T2 and T3 ranges are non-overlapping ranges. In yet embodiment, when growing the p-type contact layer 22, the temperature can start at approximately 950 degrees Celsius to approximately 1020 degrees Celsius. For example, the T1 range can be approximately 1000 degrees Celsius to approximately 1150 degrees Celsius, the T2 range can be approximately 850 degrees Celsius to approximately 1150 degrees Celsius, and the T3 range can be approximately 850 degrees Celsius to approximately 1050 degrees Celsius. At the end of the growth of the p-type layer 22, the temperature can be approximately at least approximately 1050 degrees Celsius.

In an embodiment in which one or both layers 20, 21 include GaN sublayers (e.g., as shown in FIGS. 13A and 13B), the GaN sublayers can be grown in a temperature range of T4, which is approximately 850 degrees Celsius to approximately 1050 degrees Celsius. The reduction in temperature prevents the diffusion of dopants into the active region 18. The dopant concentration can be lowest when the temperature is high, and increase for the lowest temperatures. In the embodiment shown in FIG. 14A, the temperature profile 62 is a decreasing function through the p-type interlayer 21. In an embodiment, the temperature profile 62 might exhibit a linear decrease with thickness of the p-type interlayer 21. However, it is understood that this is only illustrative, and the decrease is not required to be linear.

In the embodiment shown in FIG. 14B, co-doping can be used to neutralize point defects. In this case, a second doping profile 64 is shown in an addition to the p-type doping profile 42. The second doping profile 64 can introduce an n-type dopant, such as Si, Ge, and/or the like, into the electron blocking layer 20 and/or the p-type interlayer 21 following electron blocking layer 20 to further prevent the diffusion of the p-type dopant (e.g., Mg) into the active region 18. In general, the n-type doping can have any monotonically decreasing characteristic, e.g., as shown by the doping profile 64 in FIG. 14B. More specifically, the n-type doping profile 64 can be sufficiently small in the p-type contact layer 22 and considerably small in the p-type interlayer 21 to allow for appropriate p-type conductivity. In an embodiment, a magnitude of the n-type doping is at most 20% of the magnitude of the p-type doping. In a further embodiment, the magnitude of the n-type doping is one or two orders of magnitude smaller than the magnitude of the p-type doping throughout the last half of the p-type interlayer 21 and throughout the p-type contact layer 22. Diffusion of Mg into the active region 18 may actively utilize dislocation channels. The presence of an additional dopant, such as Si, can deter Mg atoms from diffusing through these channels. The n-type doping 64 is larger in the electron blocking layer 20 and decreases in the p-type contact layer 22. In an embodiment, when the electron blocking layer 20 and the p-type contact layer 22 both include p-type and n-type doping, the n-type doping magnitude can be at most approximately 20% of the p-type doping magnitude. Further in this embodiment, the p-type doping shape profile can coincide with the n-type doping shape profile apart from a phase factor wherein the phase factor corresponds to the shift of one profile relative to another by a certain vertical distance. The shift can be between approximately 0.2 nanometers and approximately 10 nanometers.

In any of the embodiments discussed herein, a lateral variation of p-type doping in any of the layers can be achieved through ion implantation. In an embodiment, the ion implantation can be achieved through a photolithography process where some of the semiconductor domains are masked. For example, the p-type contact layer 22 can comprise a mesa region with side walls. In this case, the lateral distribution of the p-type doping can be selected to minimize current crowding in the proximity of the side walls of the mesa region. In another embodiment, variation in the lateral composition of a layer can be achieved through an epitaxial lateral overgrowth (ELO) technique. The lateral composition of at least one of the layers can vary along the lateral dimensions of the layer by at least one percent. In an embodiment, the layer with variable composition can be the electron blocking layer 20.

A heterostructure described herein can be fabricated using any solution. For example, the various semiconductor layers described herein can be grown over a substrate using an epitaxial growth procedure. As described herein, one or more of the growth conditions utilized for a layer can be configured to create a desired property for the layer. For example, when a layer includes a superlattice, the growth conditions of such a superlattice can affect the stresses and strains in the superlattice layers. In particular, such a superlattice can comprise compressive and tensile layers that can further control the distribution of stresses throughout the heterostructure. Furthermore, the tuning of stresses and strains can be achieved by controlling the epitaxial growth parameters of a semiconductor layer. For example, by inducing three-dimensional growth of a semiconductor layer, the resulting layer can exhibit compositional and/or doping concentration inhomogeneities that can affect the resulting stresses and strains within the layer. Furthermore, such inhomogeneities can result in regions that are highly transparent interchanging with regions that are highly conductive, where the term "highly" is understood as being a relative term when comparing the transparent or conductive properties of the different regions within the semiconductor layer.

Figure 15:
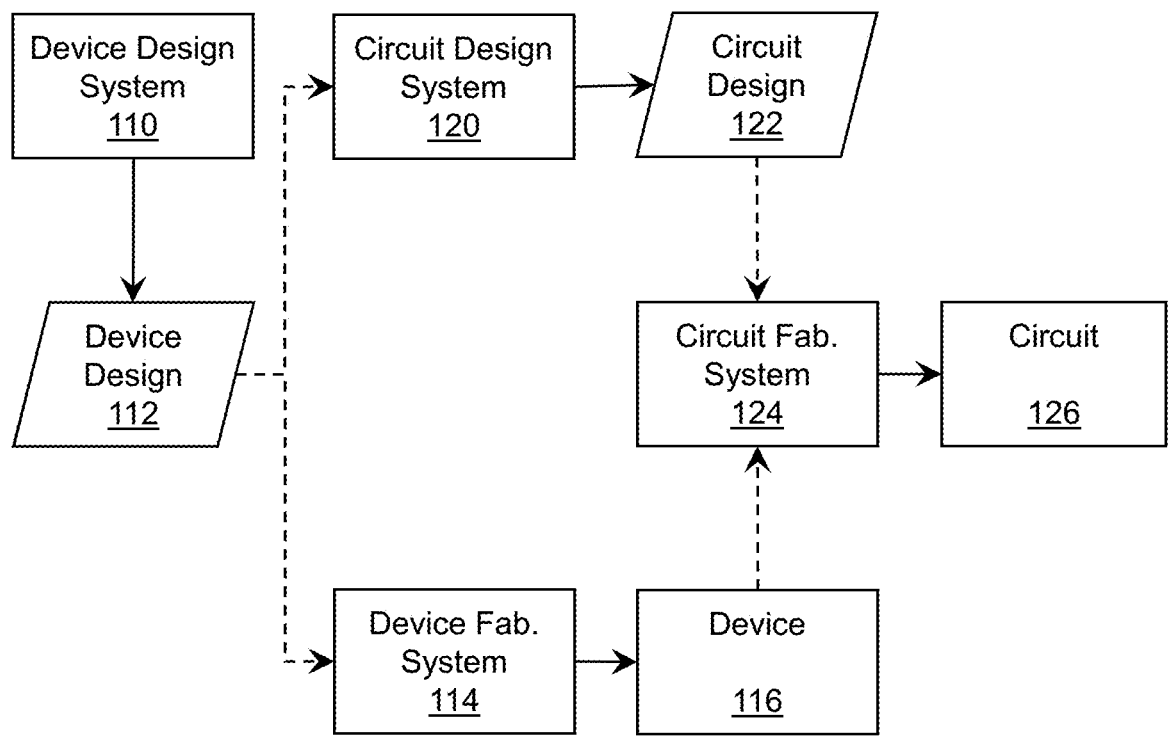
FIG. 15 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 15 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A heterostructure comprising:
a group III nitride active region including at least one quantum well and at least one barrier;
a group III nitride p-type contact layer having a p-type doping, the p-type contact layer located on a first side of the active region; and
a group III nitride electron blocking layer located between the active region and the p-type contact layer, wherein the electron blocking layer includes a plurality of sublayers, and wherein a difference in aluminum alloy composition of two immediately adjacent sublayers is at least 0.5%, and wherein a portion of the plurality of sublayers forms a superlattice of a sublayer with relatively high aluminum composition alternating with a sublayer with relatively low aluminum composition, wherein an aluminum composition of each of the sublayers including the relatively high aluminum composition is higher than an aluminum composition of the at least one barrier in the group III nitride active region and an aluminum composition of each of the sublayers including the relatively low aluminum composition is comparable to the aluminum composition of the at least one barrier in the group III nitride active region, and wherein a peak aluminum composition for the group III nitride electron blocking layer is located closer to an active region side of the group III nitride electron blocking layer than a p-type contact layer side of the group III nitride electron blocking layer.

2. The heterostructure of claim 1, wherein a thickness of each sublayer in the plurality of sublayers is in a range between approximately 0.5 nanometers and approximately 50 nanometers.

3. The heterostructure of claim 1, wherein a thickness of each of the sublayers including the relatively high aluminum composition increases from an outer portion of the group III nitride electron blocking layer to a central portion of the group III nitride electron blocking layer.

4. The heterostructure of claim 1, wherein a thickness of each of the sublayers including the relatively low aluminum composition is substantially constant across the group III nitride electron blocking layer.

5. The heterostructure of claim 1, further comprising a group III nitride p-type interlayer located between the electron blocking layer and the p-type contact layer, wherein at least a portion of the p-type interlayer includes a region of constant aluminum alloy composition.

6. A heterostructure comprising:
a group III nitride active region including at least one quantum well and at least one barrier;
a group III nitride p-type layer having a p-type doping, the p-type layer located on a first side of the active region;
a group III nitride electron blocking layer located between the active region and the p-type layer, wherein the electron blocking layer includes a plurality of sublayers, and wherein the plurality of sublayers form a superlattice in which the plurality of sublayers alternate between a sublayer with relatively high aluminum composition and a sublayer with relatively low aluminum composition; and
a group III nitride p-type interlayer located between the electron blocking layer and the p-type layer, wherein the p-type interlayer includes a region of graded aluminum alloy composition located adjacent to the electron blocking layer and a region of constant aluminum alloy composition located adjacent to the region of graded aluminum alloy composition, wherein the region of constant aluminum alloy composition has an aluminum alloy composition that is higher than an aluminum alloy composition of the p-type layer and lower than a peak aluminum alloy composition in the electron blocking layer.

7. The heterostructure of claim 6, wherein an aluminum molar fraction for the sublayers including the relatively low aluminum composition is in a range between 0 and 0.6.

8. The heterostructure of claim 6, wherein an aluminum molar fraction for the sublayers including the relatively high aluminum composition is in a range between 0.1 to 1.

9. The heterostructure of claim 6, wherein a difference in aluminum alloy composition of two immediately adjacent sublayers is at least 0.5%.

10. The heterostructure of claim 6, wherein the sublayers including the relatively high low aluminum composition have an aluminum alloy composition that is higher than an aluminum alloy composition in the active region.

11. The heterostructure of claim 6, wherein the aluminum alloy composition in the region of constant aluminum alloy composition is lower than an aluminum alloy composition in the active region and the electron blocking layer.

12. The heterostructure of claim 6, wherein an aluminum molar fraction of the sublayers including the relatively low aluminum composition remains substantially constant across the electron blocking layer.

13. The heterostructure of claim 6, wherein an aluminum molar fraction of the sublayers including the relatively high aluminum composition remains substantially constant across the electron blocking layer.

14. A heterostructure comprising:
a group III nitride active region including at least one quantum well and at least one barrier;
a group III nitride n-type layer having an n-type doping, the n-type layer located on a first side of the active region;
a group III nitride p-type layer having a p-type doping, the p-type layer located on a second side of the active region;
a group III nitride electron blocking layer located between the active region and the p-type layer, wherein the electron blocking layer includes a plurality of sublayers forming a superlattice in which the plurality of sublayers alternate between a sublayer with relatively high aluminum composition and a sublayer with relatively low aluminum composition, and wherein a thickness of each of the sublayers including the relatively high aluminum composition increases from an outer portion of the electron blocking layer to a central portion of the electron blocking layer while an aluminum composition of each of the sublayers including the relatively high aluminum composition remains substantially constant across the electron blocking layer; and a group III nitride p-type interlayer located between the electron blocking layer and the p-type layer.

15. The heterostructure of claim 14, wherein a thickness of each of the sublayers including the relatively low aluminum composition remains substantially constant across the electron blocking layer.

16. The heterostructure of claim 14, wherein an aluminum composition of the sublayers including the relatively low aluminum composition is lower than an aluminum composition of the active region.

17. The heterostructure of claim 14, wherein a difference in aluminum alloy composition of two immediately adjacent sublayers is at least 0.5%.

18. The heterostructure of claim 14, wherein an aluminum composition of the sublayers including the relatively low aluminum composition remains substantially constant across the electron blocking layer.

19. The heterostructure of claim 14, wherein an aluminum molar fraction for the sublayers including the relatively low aluminum composition is in a range between 0 and 0.6.

20. The heterostructure of claim 14, wherein an aluminum molar fraction for the sublayers including the relatively high aluminum composition is in a range between 0.1 to 1.

* * * * *